United States Patent
Tsai et al.

(10) Patent No.: US 11,855,098 B2
(45) Date of Patent: *Dec. 26, 2023

(54) SEMICONDUCTOR DEVICES HAVING DIPOLE-INDUCING ELEMENTS

(71) Applicant: Taiwan Semiconductor Manufacturing Co., Ltd., Hsinchu (TW)

(72) Inventors: Cheng-Yen Tsai, New Taipei (TW); Ming-Chi Huang, Zhubei (TW); Zoe Chen, Taipei (TW); Wei-Chin Lee, Taipei (TW); Cheng-Lung Hung, Hsinchu (TW); Da-Yuan Lee, Jhubei (TW); Weng Chang, Hsinchu (TW); Ching-Hwanq Su, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,379

(22) Filed: Nov. 14, 2022

(65) Prior Publication Data
US 2023/0073400 A1 Mar. 9, 2023

Related U.S. Application Data

(63) Continuation of application No. 17/120,921, filed on Dec. 14, 2020, now Pat. No. 11,502,080, which is a
(Continued)

(51) Int. Cl.
*H01L 29/66* (2006.01)
*H01L 29/51* (2006.01)
(Continued)

(52) U.S. Cl.
CPC ...... *H01L 27/0924* (2013.01); *H01L 21/0228* (2013.01); *H01L 21/0271* (2013.01);
(Continued)

(58) Field of Classification Search
CPC ........ H01L 21/3115–31155; H01L 21/823431; H01L 21/823821; H01L 21/845;
(Continued)

(56) References Cited

U.S. PATENT DOCUMENTS 11,502,080 B2 * 11/2022 Tsai ................ H01L 21/823864
2013/0299922 A1 11/2013 Choi et al.
(Continued)

*Primary Examiner* — Daniel P Shook
(74) *Attorney, Agent, or Firm* — Slater Matsil, LLP

(57) ABSTRACT

In an embodiment, a method includes: forming a gate dielectric layer on an interface layer; forming a doping layer on the gate dielectric layer, the doping layer including a dipole-inducing element; annealing the doping layer to drive the dipole-inducing element through the gate dielectric layer to a first side of the gate dielectric layer adjacent the interface layer; removing the doping layer; forming a sacrificial layer on the gate dielectric layer, a material of the sacrificial layer reacting with residual dipole-inducing elements at a second side of the gate dielectric layer adjacent the sacrificial layer; removing the sacrificial layer; forming a capping layer on the gate dielectric layer; and forming a gate electrode layer on the capping layer.

20 Claims, 31 Drawing Sheets

Related U.S. Application Data continuation of application No. 16/716,248, filed on Dec. 16, 2019, now Pat. No. 10,868,013, which is a continuation of application No. 16/421,759, filed on May 24, 2019, now Pat. No. 10,510,756, which is a continuation of application No. 15/998,780, filed on Aug. 15, 2018, now Pat. No. 10,304,835.

(51) Int. Cl.

| | |
|---|---|
| *H01L 29/78* | (2006.01) |
| *H01L 27/092* | (2006.01) |
| *H01L 21/324* | (2006.01) |
| *H01L 29/08* | (2006.01) |
| *H01L 21/768* | (2006.01) |
| *H01L 21/28* | (2006.01) |
| *H01L 21/8238* | (2006.01) |
| *H01L 21/02* | (2006.01) |
| *H01L 29/10* | (2006.01) |
| *H01L 21/321* | (2006.01) |
| *H01L 21/027* | (2006.01) |
| *H01L 29/49* | (2006.01) |

(52) U.S. Cl.
CPC .. *H01L 21/02318* (2013.01); *H01L 21/02321* (2013.01); *H01L 21/28088* (2013.01); *H01L 21/324* (2013.01); *H01L 21/3212* (2013.01); *H01L 21/76829* (2013.01); *H01L 21/823821* (2013.01); *H01L 21/823857* (2013.01); *H01L 21/823864* (2013.01); *H01L 21/823871* (2013.01); *H01L 29/0847* (2013.01); *H01L 29/1033* (2013.01); *H01L 29/517* (2013.01); *H01L 29/6681* (2013.01); *H01L 29/66545* (2013.01); *H01L 29/66553* (2013.01); *H01L 29/7851* (2013.01); *H01L 27/092* (2013.01); *H01L 29/4966* (2013.01); *H01L 29/513* (2013.01); *H01L 29/7848* (2013.01)

(58) Field of Classification Search
CPC ............. H01L 27/0886; H01L 27/0924; H01L 27/1211; H01L 29/41791; H01L 29/66795–66818; H01L 29/785–7856; H01L 2029/7857–7858; H01L 2924/13067; H10B 12/056; H10B 12/36
See application file for complete search history.

(56) References Cited

U.S. PATENT DOCUMENTS

| | | |
|---|---|---|
| 2015/0255557 A1 | 9/2015 | Zhu et al. |
| 2017/0154890 A1 | 6/2017 | Jin et al. |

* cited by examiner

SEMICONDUCTOR DEVICES HAVING DIPOLE-INDUCING ELEMENTS

PRIORITY CLAIM AND CROSS-REFERENCE

This application is a continuation of U.S. application Ser. No. 17/120,921, filed on Dec. 14, 2020, and entitled "Semiconductor Device and Method," which is a continuation of U.S. application Ser. No. 16/716,248, filed on Dec. 16, 2019, and entitled "Semiconductor Device and Method," now U.S. Pat. No. 10,868,013 issued on Dec. 15, 2020, which application is a continuation of U.S. application Ser. No. 16/421,759, filed on May 24, 2019, and entitled "Semiconductor Device and Method," now U.S. Pat. No. 10,510,756 issued on Dec. 17, 2019, which application is a continuation of U.S. application Ser. No. 15/998,780, filed on Aug. 15, 2018, and entitled "Semiconductor Device and Method," now U.S. Pat. No. 10,304,835 issued on May 28, 2019, which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
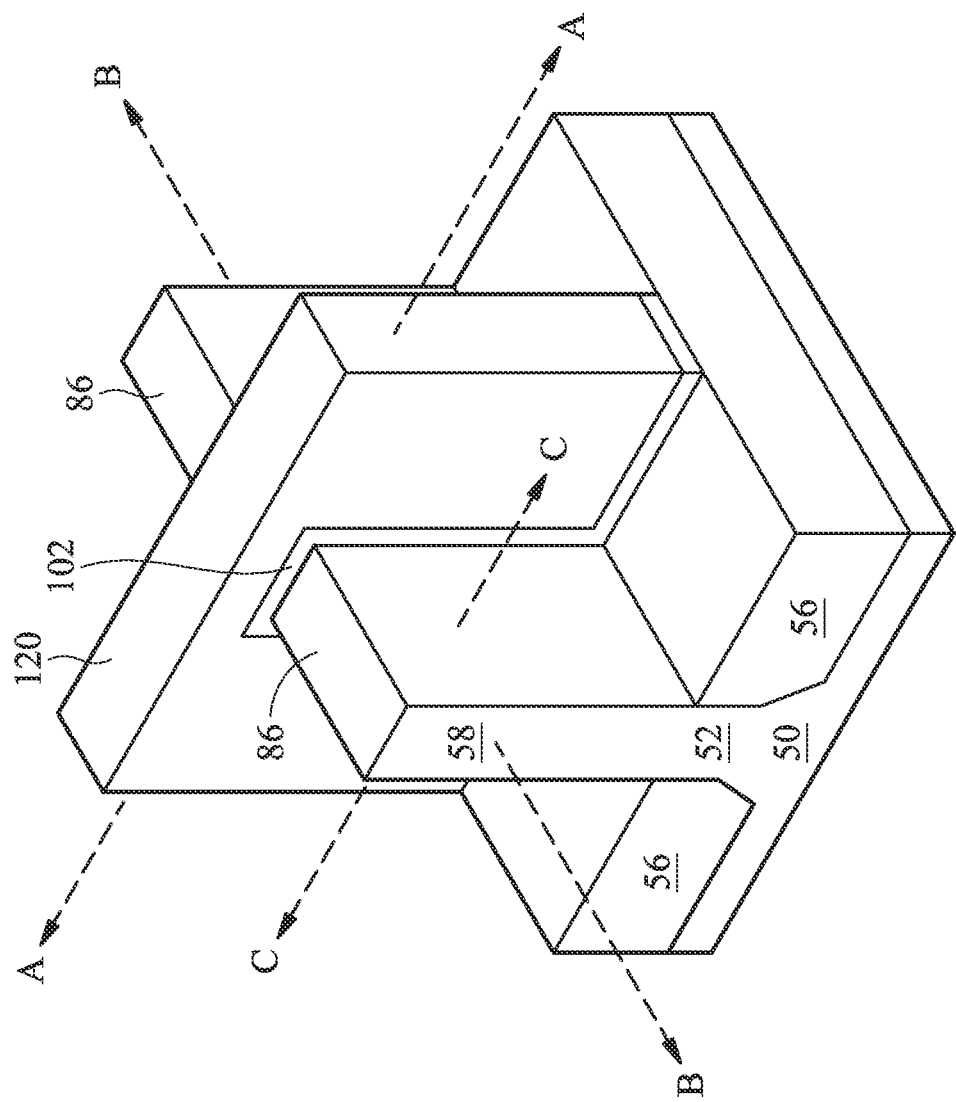
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a doping layer is formed on a gate dielectric layer, and dipole-inducing elements (e.g., La, Al, Sc, Ru, Zr, Er, Mg, Sr, etc.) from the doping layer are driven through the gate dielectric layer by an annealing process. The doping layer is then removed. A sacrificial layer is formed on the gate dielectric layer. The sacrificial layer reacts (e.g., bonds to or interacts) with residual dipole-inducing elements that remain on the gate dielectric layer after removal of the doping layer. The sacrificial layer is then removed and replaced with a capping layer. By forming dipole-inducing elements at the interface of the gate dielectric layer and underlying layers, the threshold voltage of subsequently formed devices may be controlled. Further, by removing dipole-inducing elements from the interface of the gate dielectric layer and overlying layers, the breakdown voltage of the gate dielectric layer may be improved.

FIG. 1 illustrates an example of a FinFET in a three-dimensional view, in accordance with some embodiments. The FinFET comprises a fin 58 on a substrate 50. Isolation regions 56 are formed on the substrate 50, and the fin 58 protrudes above and from between neighboring isolation regions 56. A gate dielectric layer 102 is along sidewalls and over a top surface of the fin 58, and a gate electrode 120 is over the gate dielectric layer 102. Source/drain regions 86 are disposed in opposite sides of the fin 58 with respect to the gate dielectric layer 102 and gate electrode 120. FIG. 1 further illustrates reference cross-sections that are used in later figures. Cross-section A-A is across a channel, gate dielectric layer 102, and gate electrode 120 of the FinFET. Cross-section B-B is perpendicular to cross-section A-A and is along a longitudinal axis of the fin 58 and in a direction of, for example, a current flow between the source/drain regions 86. Cross-section C-C is parallel to cross-section B-B and extends through a source/drain region of the FinFET Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2-6 are cross-sectional views of intermediate stages in the manufacturing of FinFETs, in accordance with some embodiments. FIGS. 2 through 6 are shown along reference cross-section A-A illustrated in FIG. 1, except for multiple fins/FinFETs.

Figure 2:
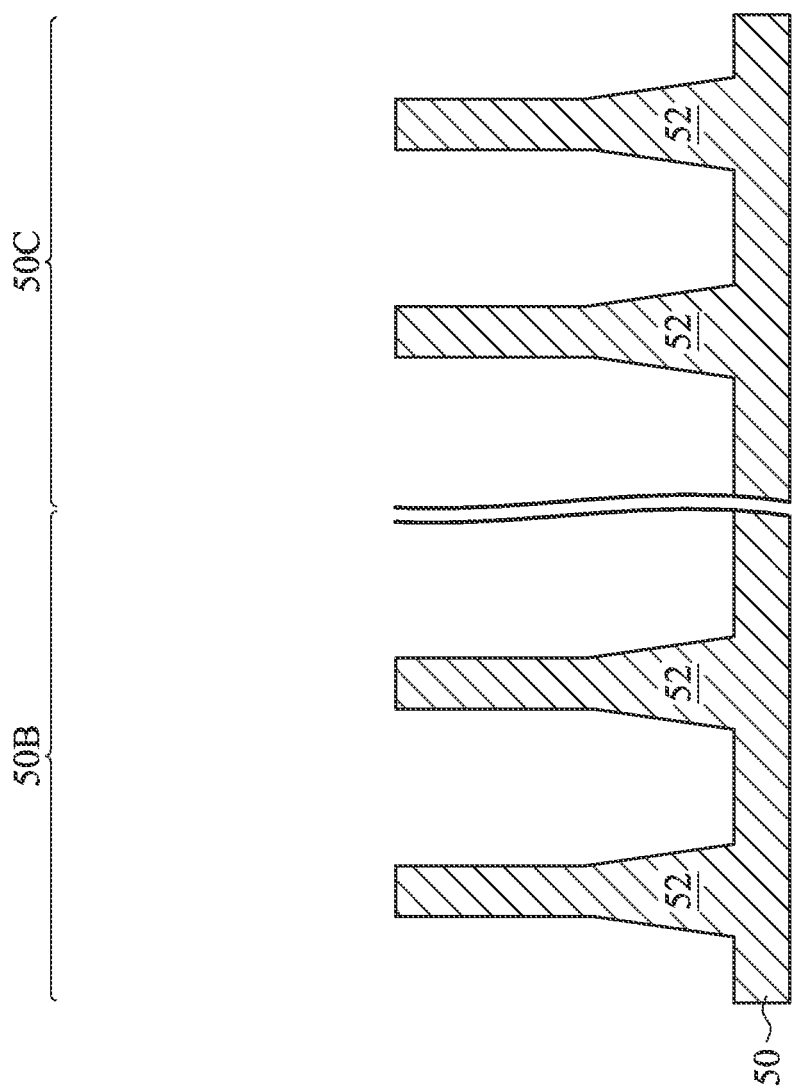
FIGS. 2, 3, 4, 5, 6, 7, 8, 9A, 9B, 9C, 10, 11, 12, 13, 14, 15, 16, 17, 18, and 19 are cross-sectional views of intermediate stages in the manufacturing of FinFETs, in accordance with some embodiments.

In FIG. 2, fins 52 are formed in a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by a divider), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 3:
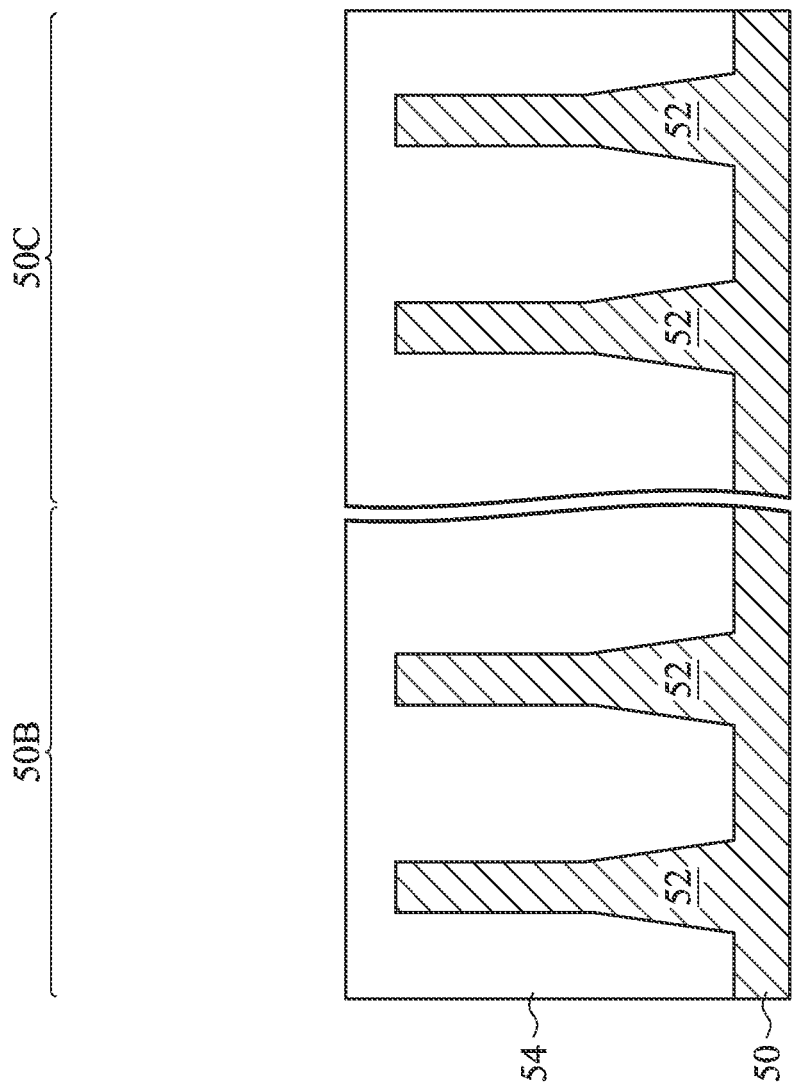

In FIG. 3, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 4:
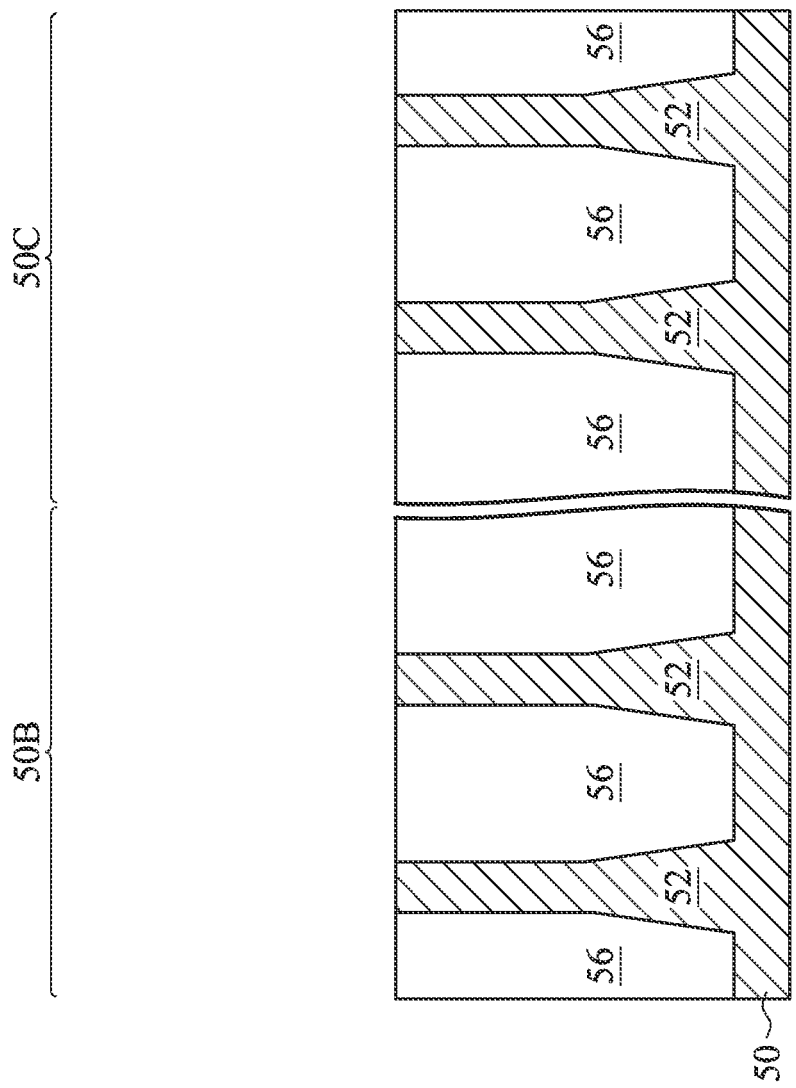

In FIG. 4, a planarization process is applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

Figure 5:
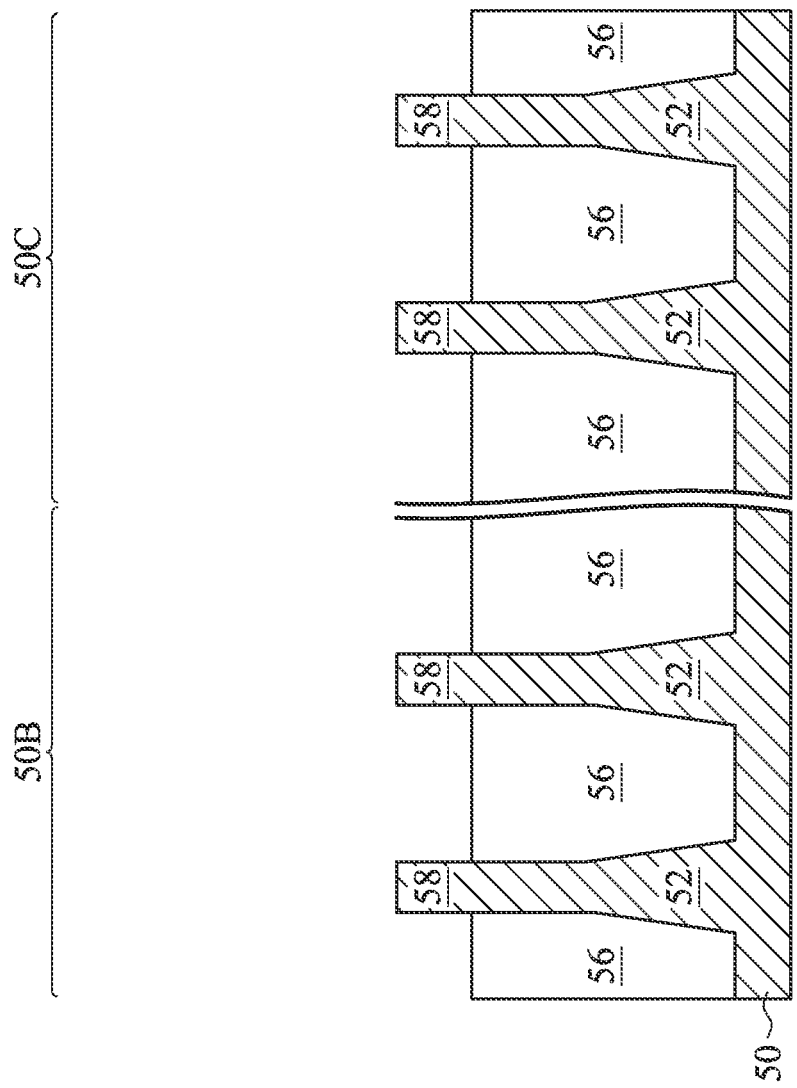

In FIG. 5, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 4 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate doped regions (not shown, sometimes referred to as well regions) may be formed in the fins 58, the fins 52, and/or the substrate 50. In some embodiments, a P-type doped region may be formed in the region 50B, and an N-type doped region may be formed in the region 50C. In some embodiments, only P-type or only N-type doped regions are formed in both the region 50B and the region 50C.

In the embodiments with different types of doped regions, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist is removed, such as by an acceptable ashing process. Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF2, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist may be removed, such as by an acceptable ashing process. After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 6:
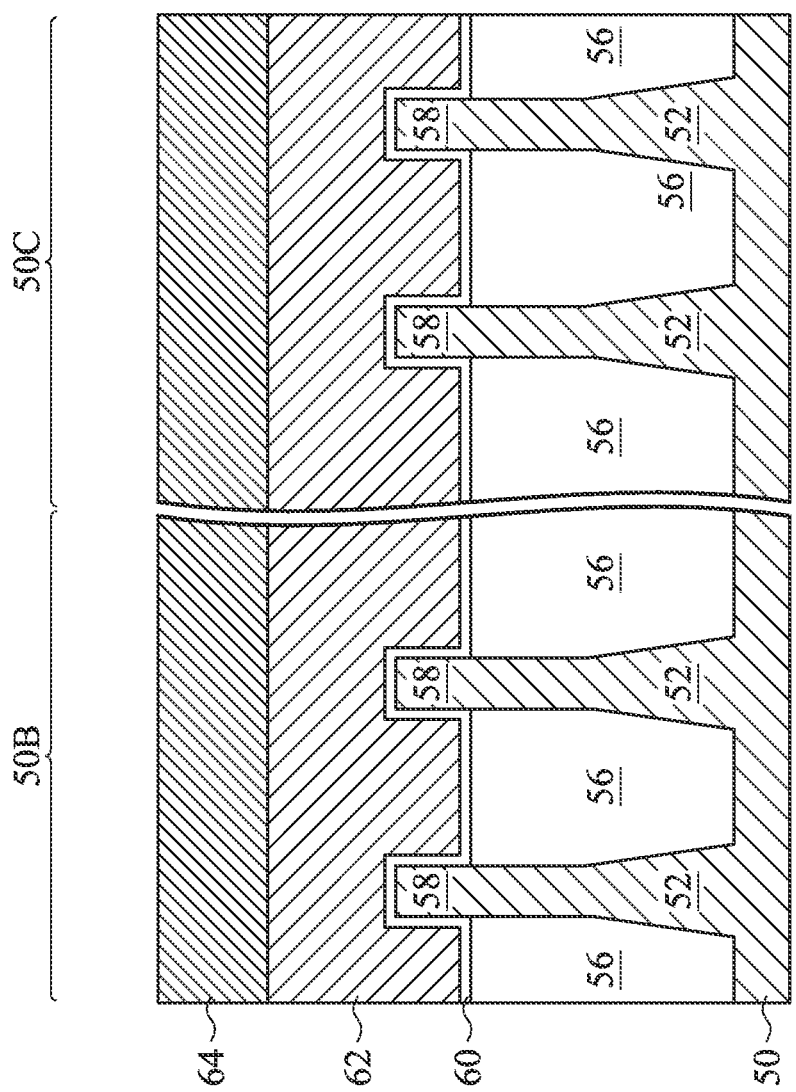

In FIG. 6, a dummy dielectric layer 60 is formed over the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may be deposited over the dummy gate layer 62. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 7-19, 21-23, and 25-27 are cross-sectional views of intermediate stages in the manufacturing of FinFETs, in accordance with some embodiments. FIGS. 7-9A, 10-19, 21-23, and 25-27 are shown along reference cross-section B-B illustrated in FIG. 1, except for multiple fins/FinFETs. FIGS. 9B-9C are shown along reference cross-section C-C illustrated in FIG. 1, except for multiple fins/FinFETs.

FIGS. 7-18, 21-22, and 25-27 illustrate a region 58B and a region 58C of one or more of the fins 58. The regions 58B and 58C may be in the same fin 58 or different fins 58. Devices in the different regions 58B and 58C are formed to have different threshold voltages.

Figure 7:
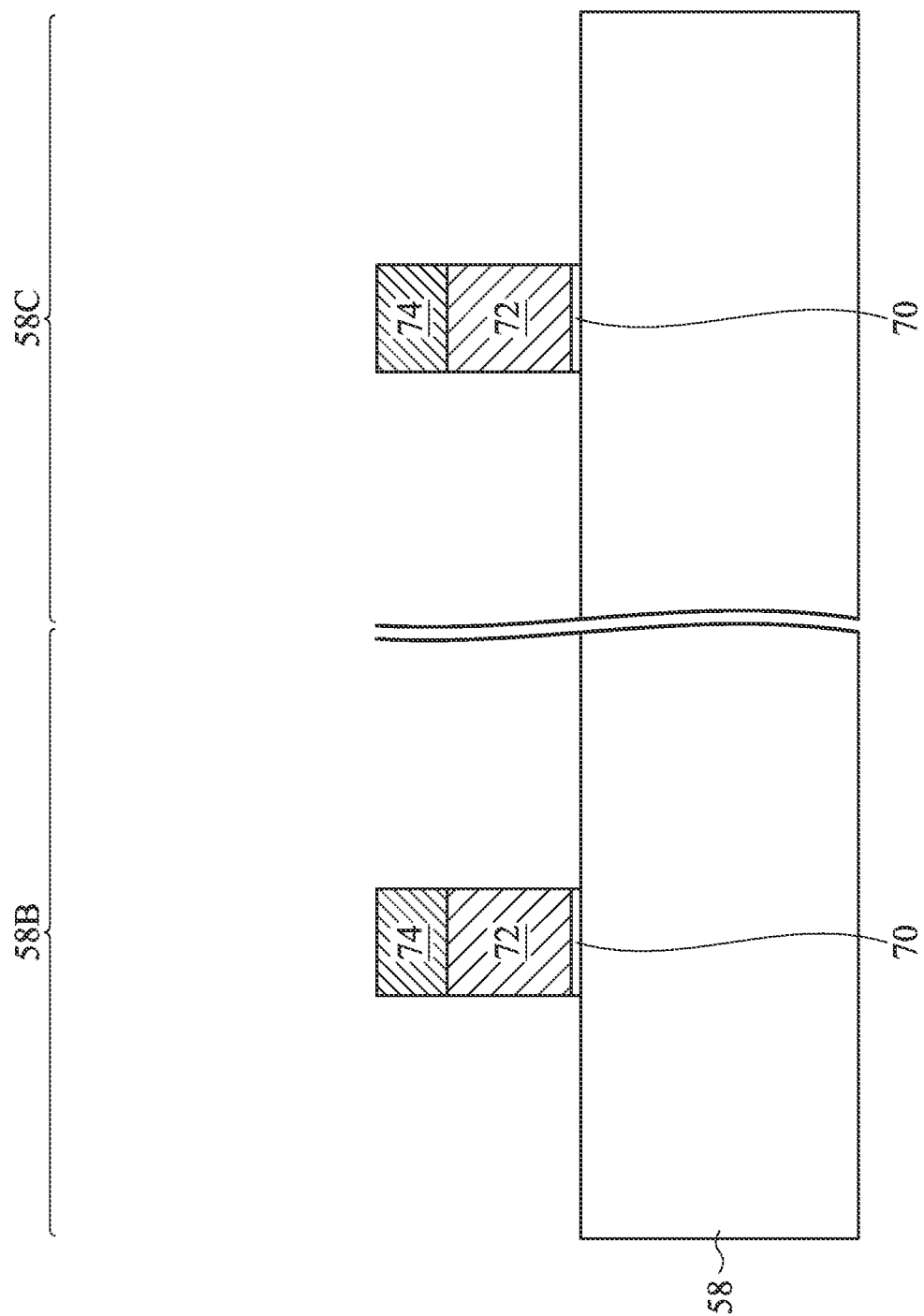

In FIG. 7, the mask layer 64 is patterned using acceptable photolithography and etching techniques to form masks 74. The pattern of the masks 74 then may be transferred to the dummy gate layer 62 and the dummy dielectric layer 60 by an acceptable etching technique to, respectively, form dummy gates 72 and dummy gate dielectric layers 70. The dummy gates 72 and dummy gate dielectric layers 70 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins.

Figure 8:
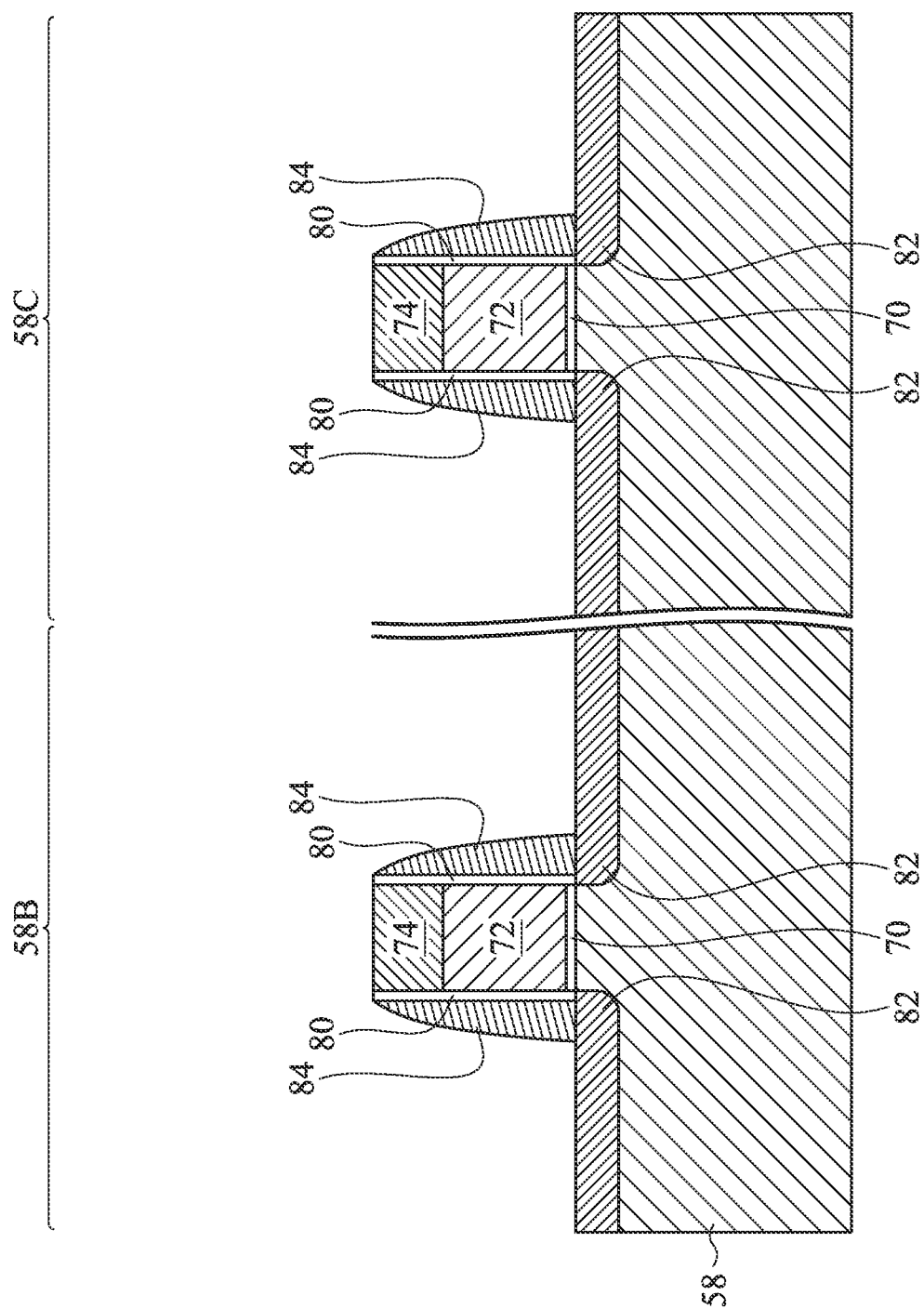

In FIG. 8, gate seal spacers 80 can be formed on exposed surfaces of the dummy gates 72 and/or the fins 58. A thermal oxidation or a deposition followed by an anisotropic etch may form the gate seal spacers 80. In some embodiments, the gate seal spacers 80 may be formed of a nitride, such as silicon nitride, silicon oxynitride, silicon carbide, silicon carbonitride, the like, or a combination thereof. The gate seal spacers 80 seal the sidewalls of subsequently formed gate stacks, and may act as additional gate spacing layers.

Further, implants for lightly doped source/drain (LDD) regions 82 may be performed. In the embodiments with different device types, similar to the implants discussed above in FIG. 5, a mask, such as a photoresist, may be formed over the first region 50B, while exposing the second region 50C, and appropriate type (e.g., n-type or p-type) impurities may be implanted into the exposed fins 58 in the second region 50C. The mask may then be removed. Subsequently, a mask, such as a photoresist, may be formed over the second region 50C while exposing the first region 50B, and appropriate type impurities may be implanted into the exposed fins 58 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further, gate spacers 84 are formed on the gate seal spacers 80 along sidewalls of the dummy gates 72 and over the LDD regions 82. The gate spacers 84 may be formed by conformally depositing a material and subsequently anisotropically etching the material. The material of the gate spacers 84 may be silicon nitride, SiCN, a combination thereof, or the like. The etch may be selective to the material of the gate spacers 84, such that the LDD regions 82 are not etched during the formation of the gate spacers 84.

Figure 9A:
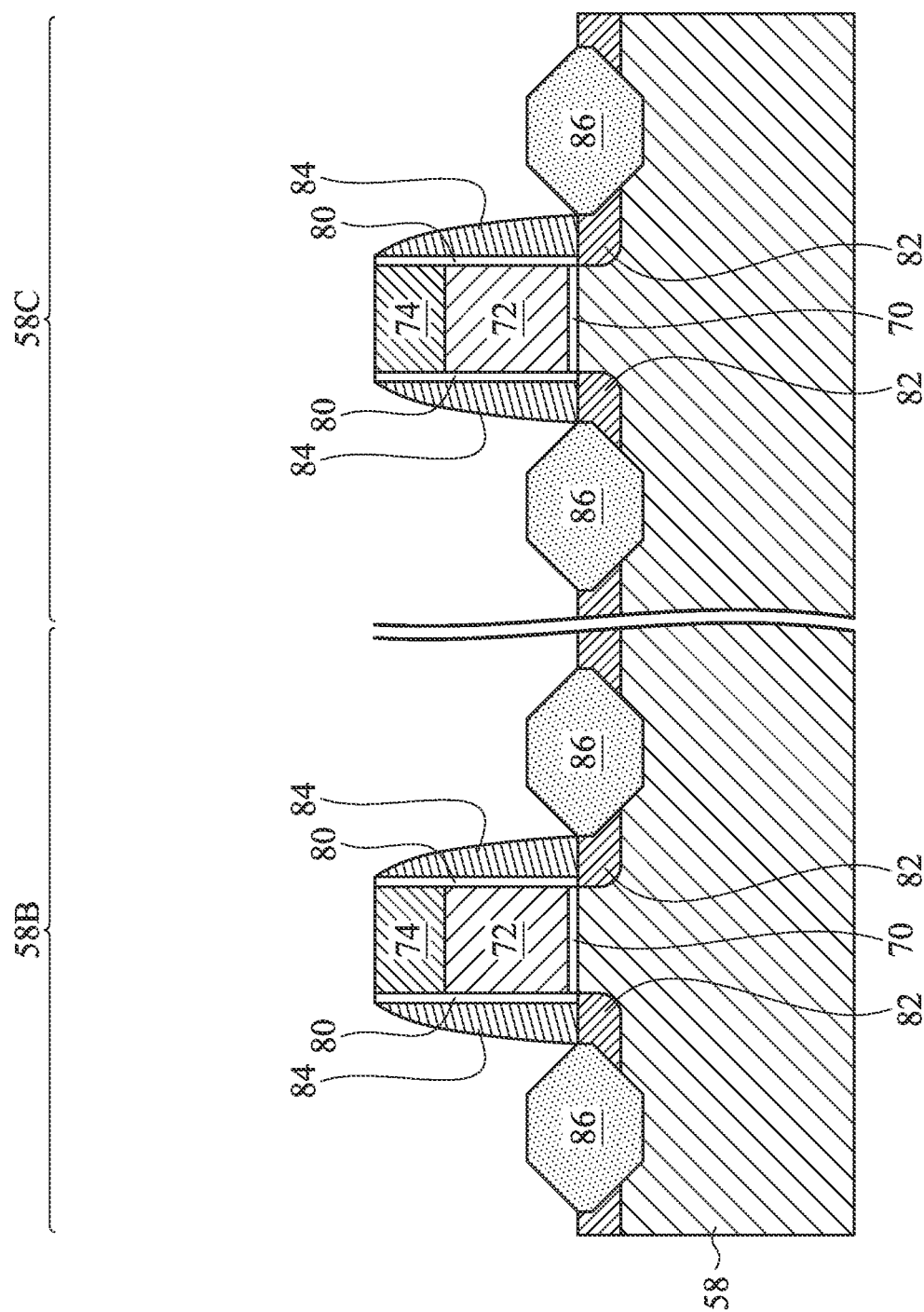
Figure 9C:
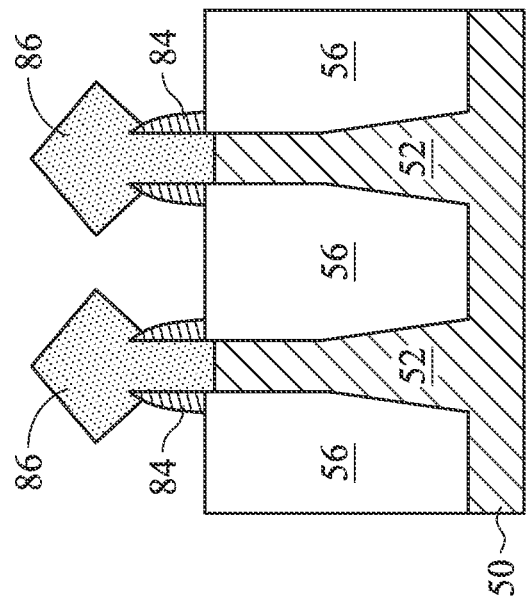
Figure 9B:
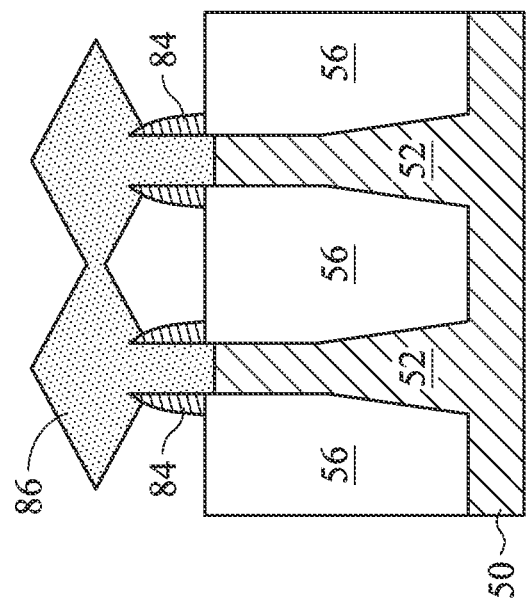

In FIGS. 9A, 9B, and 9C, epitaxial source/drain regions 86 are formed in the fins 58. The epitaxial source/drain regions 86 are formed in the fins 58 such that each dummy gate 72 is disposed between respective neighboring pairs of the epitaxial source/drain regions 86. In some embodiments, the epitaxial source/drain regions 86 may extend through the LDD regions 82. In some embodiments, the gate seal spacers 80 and gate spacers 84 are used to separate the epitaxial source/drain regions 86 from the dummy gates 72 by an appropriate lateral distance so that the epitaxial source/drain regions 86 do not short out subsequently formed gates of the resulting FinFETs.

The epitaxial source/drain regions 86 in the region 50B, e.g., the NMOS region, may be formed by masking the region 50C, e.g., the PMOS region, and etching source/drain regions of the fins 58 in the region 50B to form recesses in the fins 58. Then, the epitaxial source/drain regions 86 in the region 50B are epitaxially grown in the recesses. The epitaxial source/drain regions 86 may include any acceptable material, such as appropriate for n-type FinFETs. For example, if the fins 58 are silicon, the epitaxial source/drain regions 86 in the region 50B may include silicon, SiC, SiCP, SiP, or the like. The epitaxial source/drain regions 86 in the region 50B may have surfaces raised from respective surfaces of the fins 58 and may have facets.

The epitaxial source/drain regions 86 in the region 50C, e.g., the PMOS region, may be formed by masking the region 50B, e.g., the NMOS region, and etching source/drain regions of the fins 58 in the region 50C to form recesses in the fins 58. Then, the epitaxial source/drain regions 86 in the region 50C are epitaxially grown in the recesses. The epitaxial source/drain regions 86 may include any acceptable material, such as appropriate for p-type FinFETs. For example, if the fins 58 are silicon, the epitaxial source/drain regions 86 in the region 50C may comprise SiGe, SiGeB, Ge, GeSn, or the like. The epitaxial source/drain regions 86 in the region 50C may also have surfaces raised from respective surfaces of the fins 58 and may have facets.

The epitaxial source/drain regions 86 are in situ doped during growth to form source/drain regions. The epitaxial source/drain regions 86 have the same doping type as the respective LDD regions 82, and may be doped with the same dopants or different dopants. The epitaxial source/drain regions 86 may have an impurity concentration of between about $10^{19}$ cm$^{-3}$ and about $10^{21}$ cm$^{-3}$. The n-type and/or p-type impurities for source/drain regions may be any of the impurities previously discussed. Because the epitaxial source/drain regions 86 are in situ doped during growth, they are not doped by implantation. However, the doping profile and concentration of the LDD regions 82 produced according to some embodiments may be similar to that which would be produced if the epitaxial source/drain regions 86 were doped by implantation. Improving the doping profile and concentration of the LDD regions 82 may improve the performance and reliability of the resulting semiconductor devices.

As a result of the epitaxy processes used to form the epitaxial source/drain regions 86 in the region 50B and the region 50C, upper surfaces of the epitaxial source/drain regions have facets which expand laterally outward beyond a sidewalls of the fins 58. In some embodiments, these facets cause adjacent epitaxial source/drain regions 86 of a same finFET to merge, as illustrated by the embodiment of FIG. 9B. In other embodiments, adjacent epitaxial source/drain regions 86 remain separated after the epitaxy process is completed, as illustrated by the embodiment of FIG. 9C.

Figure 10:
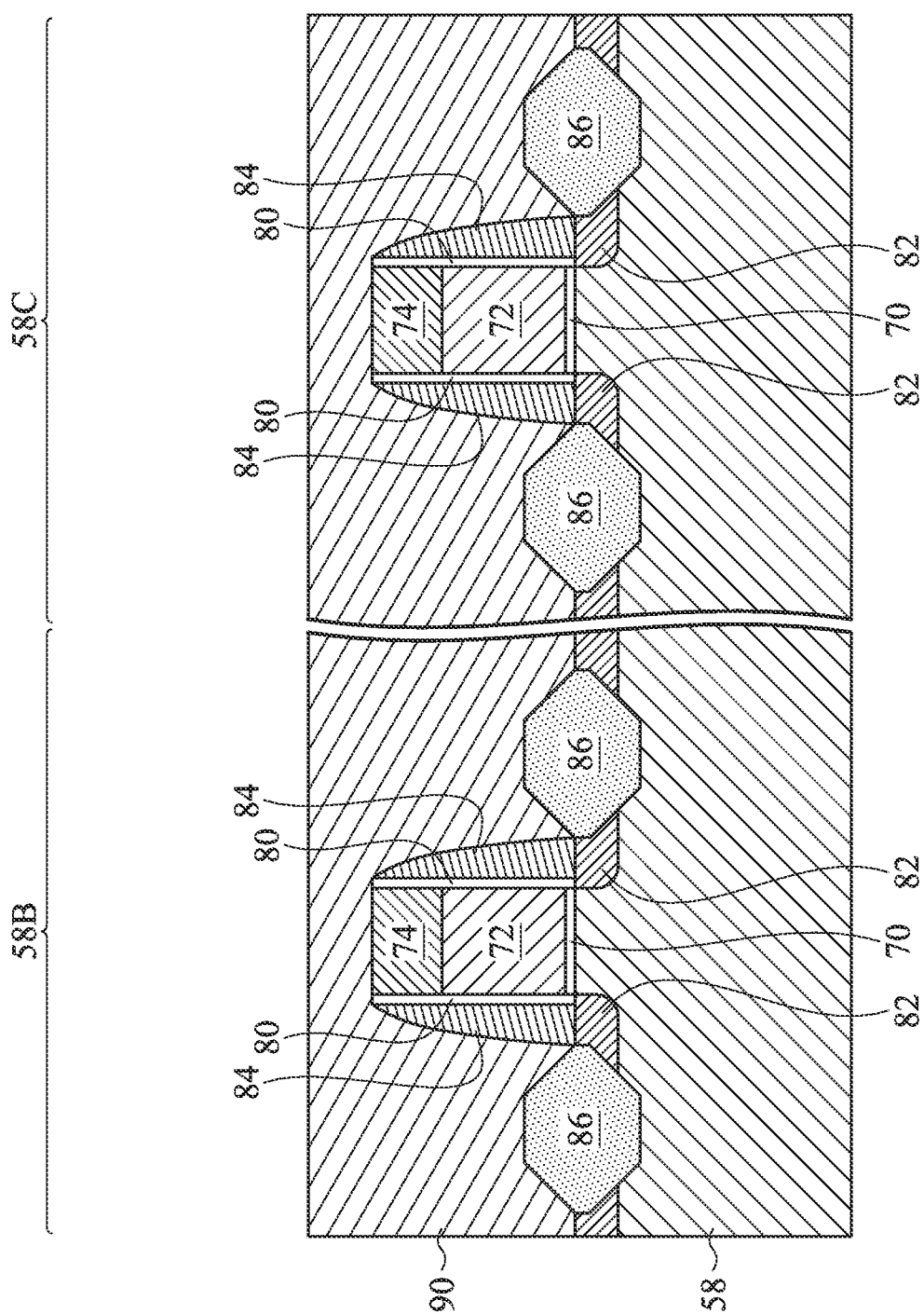

In FIG. 10, an ILD 90 is deposited over the fins 58. The ILD 90 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 90 and the epitaxial source/drain regions 86, the gate spacers 84, the gate seal spacers 80, and the masks 74.

Figure 11:
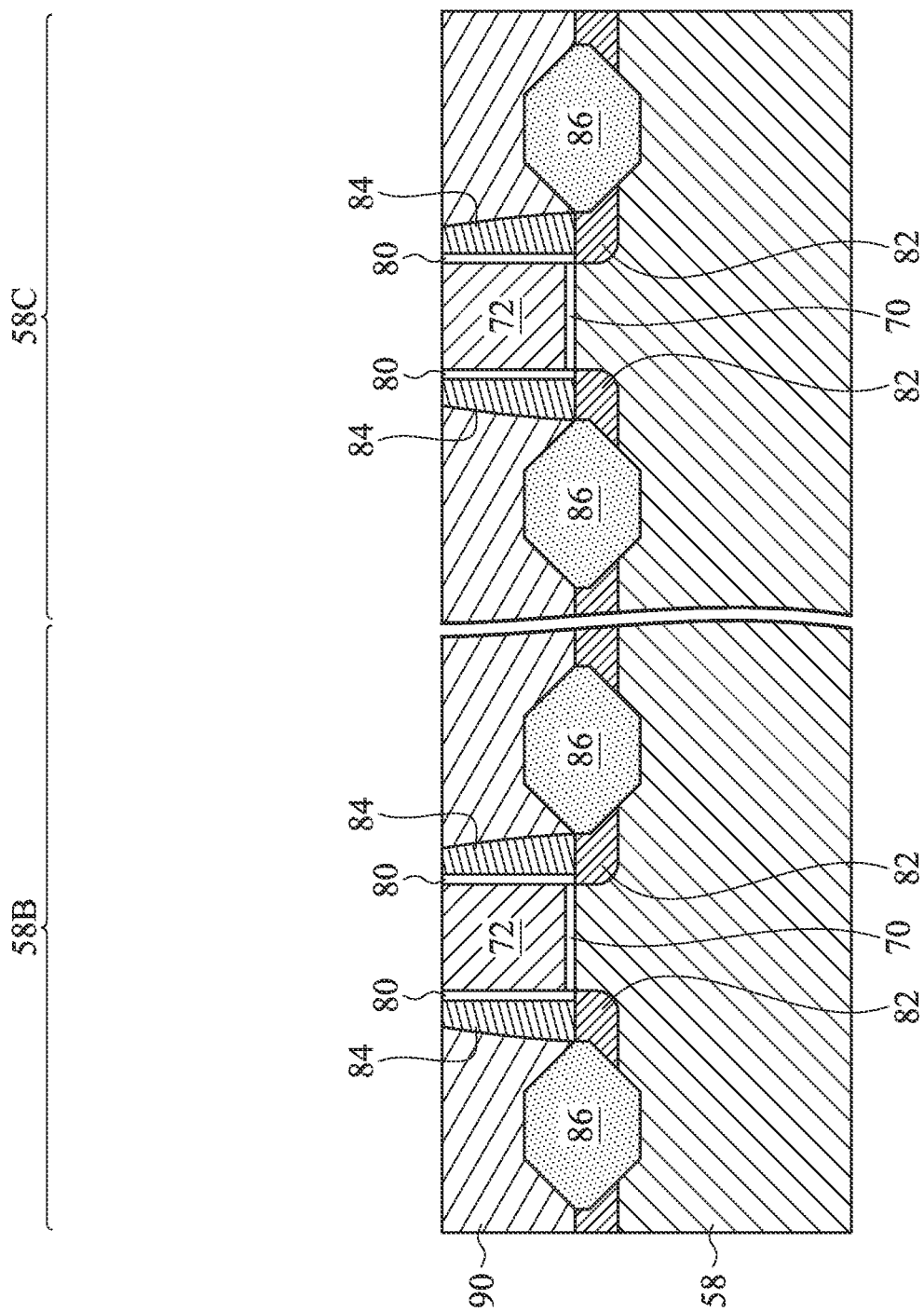

In FIG. 11, a planarization process, such as a CMP, may be performed to level the top surface of the ILD 90 with the top surfaces of the dummy gates 72. The planarization process may also remove the masks 74 on the dummy gates 72, and portions of the gate seal spacers 80 and the gate spacers 84 along sidewalls of the masks 74. After the planarization process, top surfaces of the dummy gates 72, the gate seal spacers 80, the gate spacers 84, and the ILD 90 are level. Accordingly, the top surfaces of the dummy gates 72 are exposed through the ILD 90.

Figure 12:
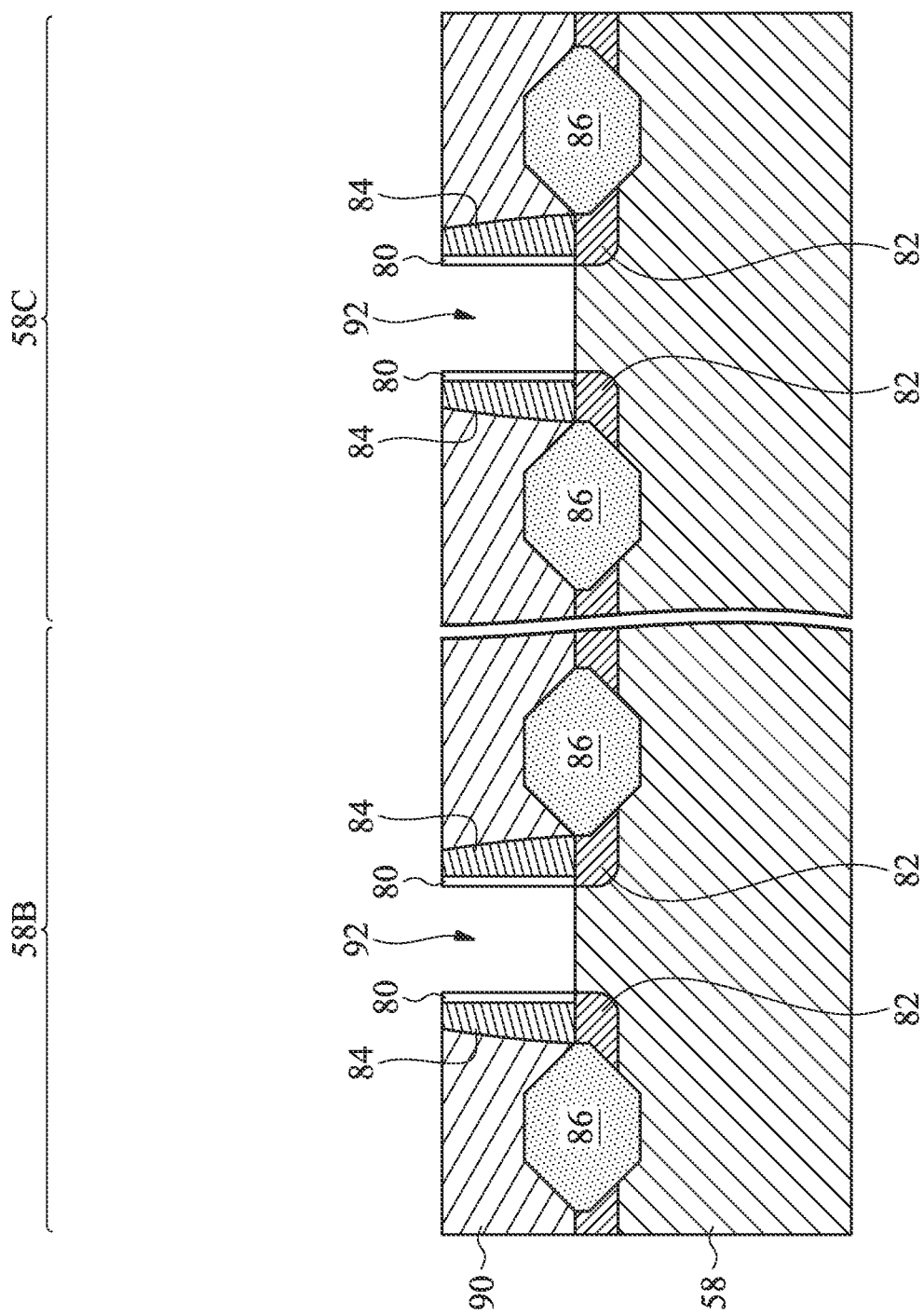

In FIG. 12, the dummy gates 72 and portions of the dummy gate dielectric layers 70 directly underlying the exposed dummy gates 72 are removed in an etching step(s), so that recesses 92 are formed. In some embodiments, the dummy gates 72 are removed by an anisotropic dry etch process. For example, the etching process may include a dry etch process using reaction gas(es) that selectively etch the dummy gates 72 without etching the ILD 90, the gate spacers 84, or the gate seal spacers 80. Each recess 92 exposes a channel region of a respective fin 58. Each channel region is disposed between neighboring pairs of the epitaxial source/drain regions 86. During the removal, the dummy gate dielectric layers 70 may be used as an etch stop layer when the dummy gates 72 are etched. The dummy gate dielectric layers 70 may then be removed after the removal of the dummy gates 72.

Figure 13:
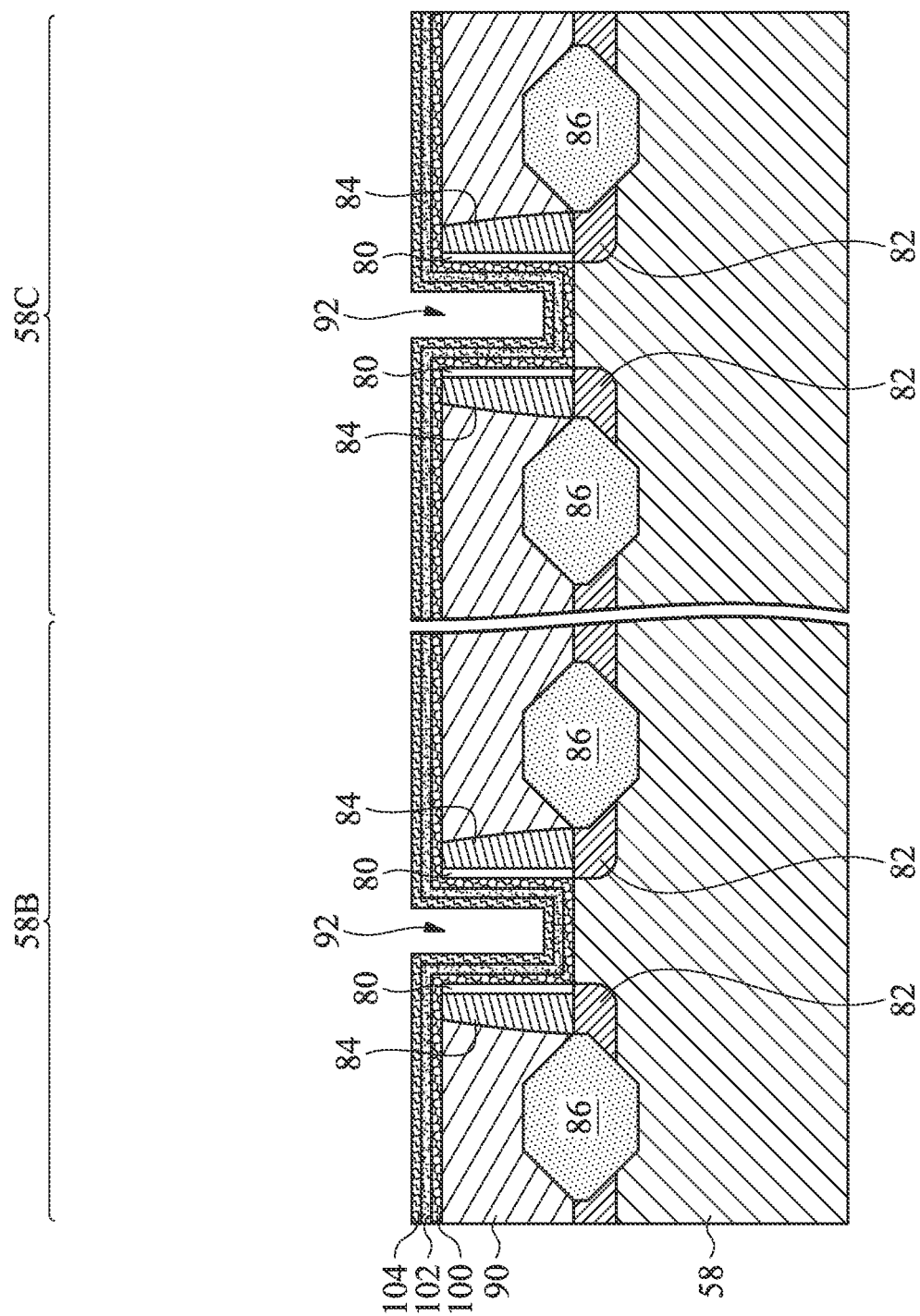

In FIG. 13, an interface layer 100 is formed in the recesses 92. The interface layer 100 is conformally formed over the fin 58, and thus the interface layer 100 lines sidewalls and the bottom surface of the recesses 92. The interface layer 100 may also cover the upper surface of the ILD 90. In accordance with some embodiments, the interface layer 100 is an oxide of the material of the fin 58, and may be formed by, e.g., oxidizing the fins 58 in the recesses 92. The interface layer 100 may also be formed by a deposition process, such as a chemical vapor deposition (CVD) process, a physical vapor deposition (PVD) process, an atomic layer deposition (ALD) process, or the like.

Further, a gate dielectric layer 102 is formed over the interface layer 100. The gate dielectric layer 102 may be deposited conformally in the recesses 92, such as on the top surfaces and the sidewalls of the fins 58 and on sidewalls of the interface layer 100 in the recesses 92. The gate dielectric layer 102 may also be formed along top surfaces of the ILD 90. In accordance with some embodiments, the gate dielectric layer 102 is a high-k dielectric material having a k value greater than about 7.0, and may include a metal oxide or a silicate of Hf, Al, Zr, La, Mg, Ba, Ti, Pb, and combinations thereof. The formation methods of the gate dielectric layer 102 may include Molecular-Beam Deposition (MBD), ALD, PECVD, and the like.

Further, a doping layer 104 is formed over the gate dielectric layer 102. The doping layer 104 may be formed from an oxide, nitride, or carbide of a dipole-inducing element such as La, Al, Sc, Ru, Zr, Er, Mg, Sr, and combinations thereof. The doping layer 104 may be formed by PVD, CVD, ALD, or other suitable deposition methods. In a particular embodiment, the doping layer 104 is formed from an oxide of La, e.g., $LaO_x$.

Figure 14:
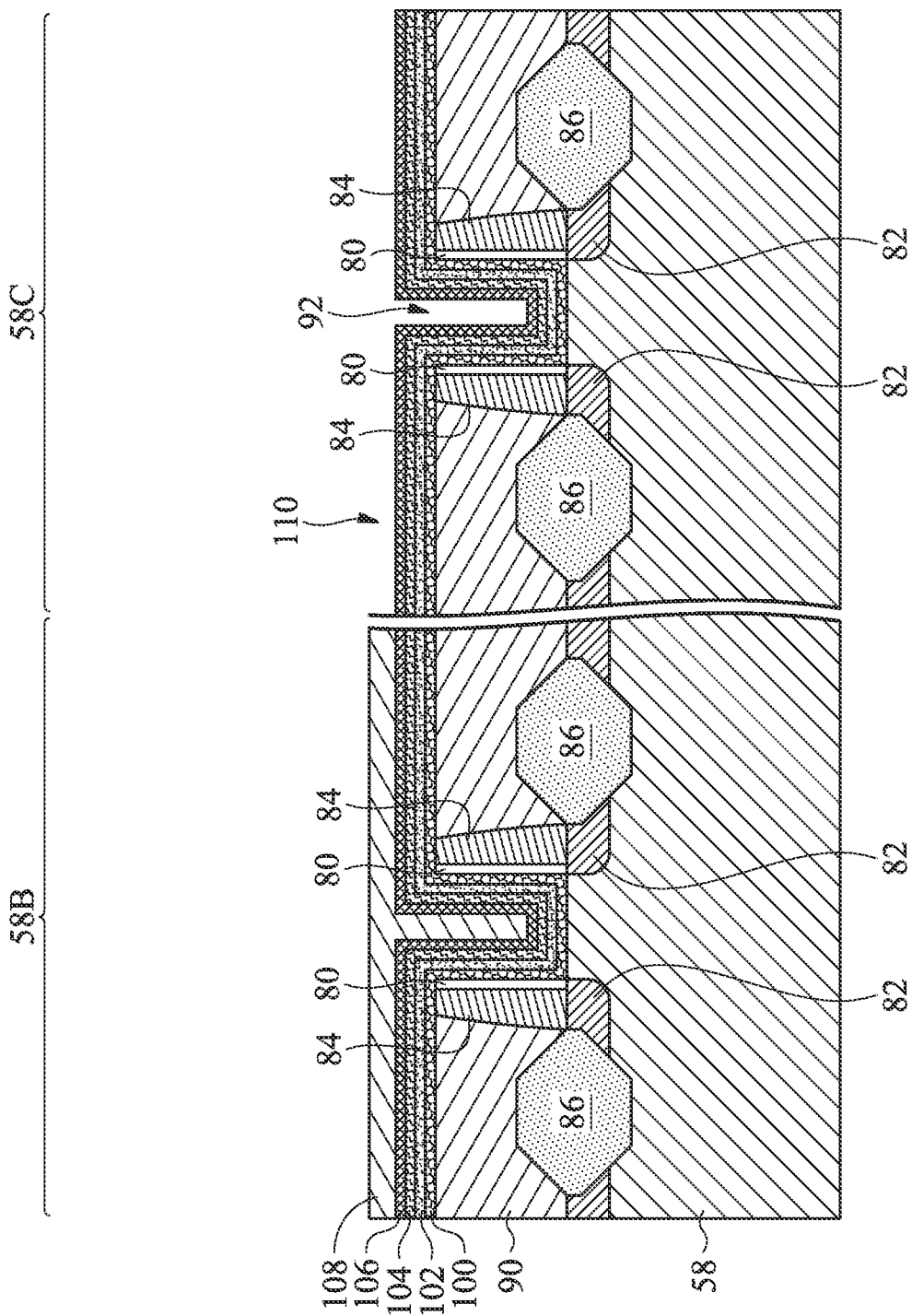

In FIG. 14, a mask layer 106 is formed over the doping layer 104. The mask layer 106 may be formed of a hard masking material, and may include a metal and/or a dielectric. In embodiments where the mask layer 106 includes a metal, it may be formed of titanium nitride, titanium, tantalum nitride, tantalum, aluminum oxide, or the like. In embodiments where the mask layer 106 includes a dielectric, it may be formed of an oxide, a nitride, or the like. The mask layer 106 may be formed by PVD, Radio Frequency PVD (RFPVD), Atomic Layer Deposition (ALD), or the like.

Further, a photoresist 108 is formed over the mask layer 106. The photoresist 108 may be a single-layer photoresist, a tri-layer photoresist, or the like. In an embodiment, the photoresist 108 is a tri-layer photoresist that includes a bottom layer, a middle layer, and an upper layer (not shown). The upper layer may be formed of a photosensitive material, such as a photoresist, which may comprise organic materials. The bottom layer may be a bottom anti-reflective coating (BARC). The middle layer may be formed of or include an inorganic material, which may be a nitride (such as silicon nitride), an oxynitride (such as silicon oxynitride), an oxide (such as silicon oxide), or the like. The middle layer has a high etching selectivity relative to the upper layer and the bottom layer. As a result, the upper layer is used as an etching mask for the patterning of the middle layer, and the middle layer is used as an etching mask for the patterning of the bottom layer.

After formation, the photoresist 108 is patterned using any suitable photolithography technique to form openings 110 exposing the recesses 92 in the region 58C. For example, an etching process including etchants such as $CF_4$, $CH_3F$, $H_2$, $N_2$, Ar, the like, or a combination thereof may be used to remove portions of the photoresist 108 without substantially damaging the mask layer 106. In the embodiment shown, the openings 110 are formed in the region 58C of the fins 58. Gates of the devices formed in the covered region 58B will have a modulated work function. As such, resulting devices in the regions 58B and 58C will have different threshold voltages.

Figure 15:
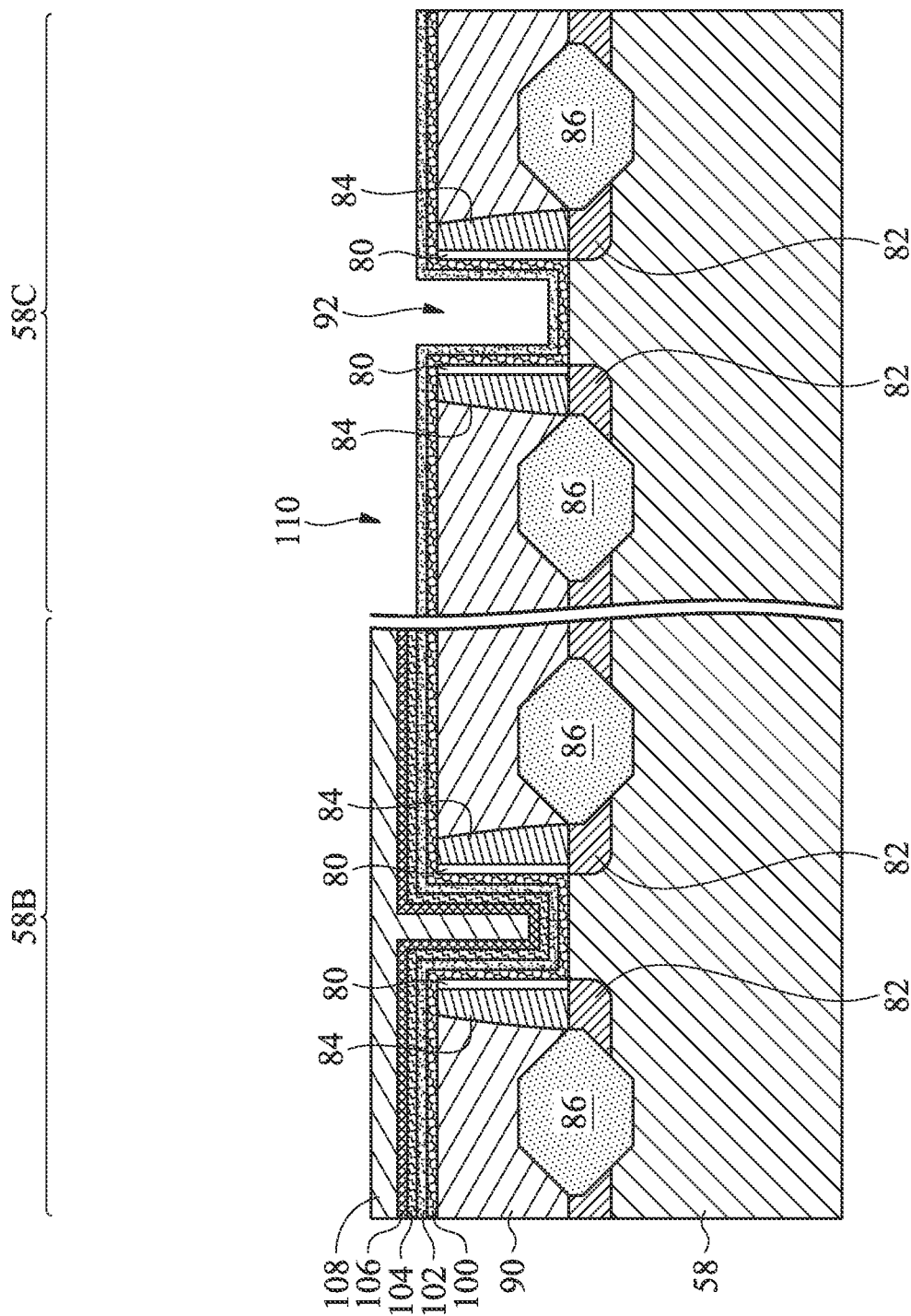

In FIG. 15, a plurality of etching processes are performed to transfer the pattern of the photoresist 108 to the doping layer 104, thereby extending the openings 110 through the doping layer 104. As such, remaining portions of the doping layer 104 are in the regions 58B where the metal gate work functions will be modulated. In an embodiment, one or more wet etching processes are performed using etchants such as an ammonia peroxide mixture (APM), sulfuric acid peroxide mixture (SPM), hydrochloric acid peroxide mixture (HPM), $H_2O_2$, $O_3$, or the like. In an embodiment, a first etching process is performed using a HPM to transfer the pattern of the photoresist 108 to the mask layer 106, and a second etching process is performed using an APM to transfer the pattern of the mask layer 106 to the doping layer 104.

Figure 16:
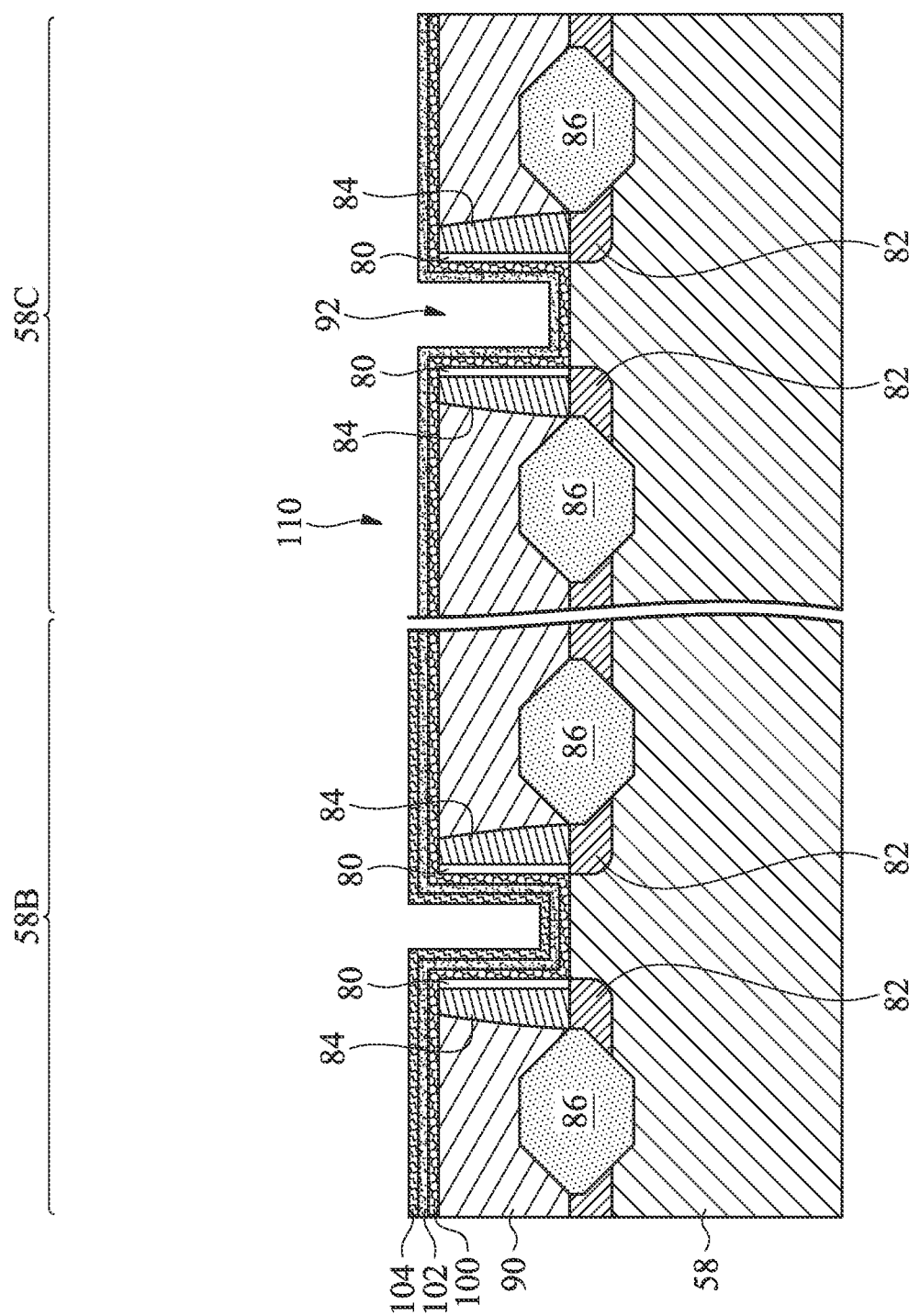

In FIG. 16, remaining portions of the photoresist 108 and mask layer 106 are removed to expose the recesses 92 in the region 58B. The remaining portions of the photoresist 108 may be removed by an acceptable ashing process, and the remaining portions of the mask layer 106 may be removed by repeating the first etching process, e.g., by etching the mask layer 106 with an APM.

Figure 17:
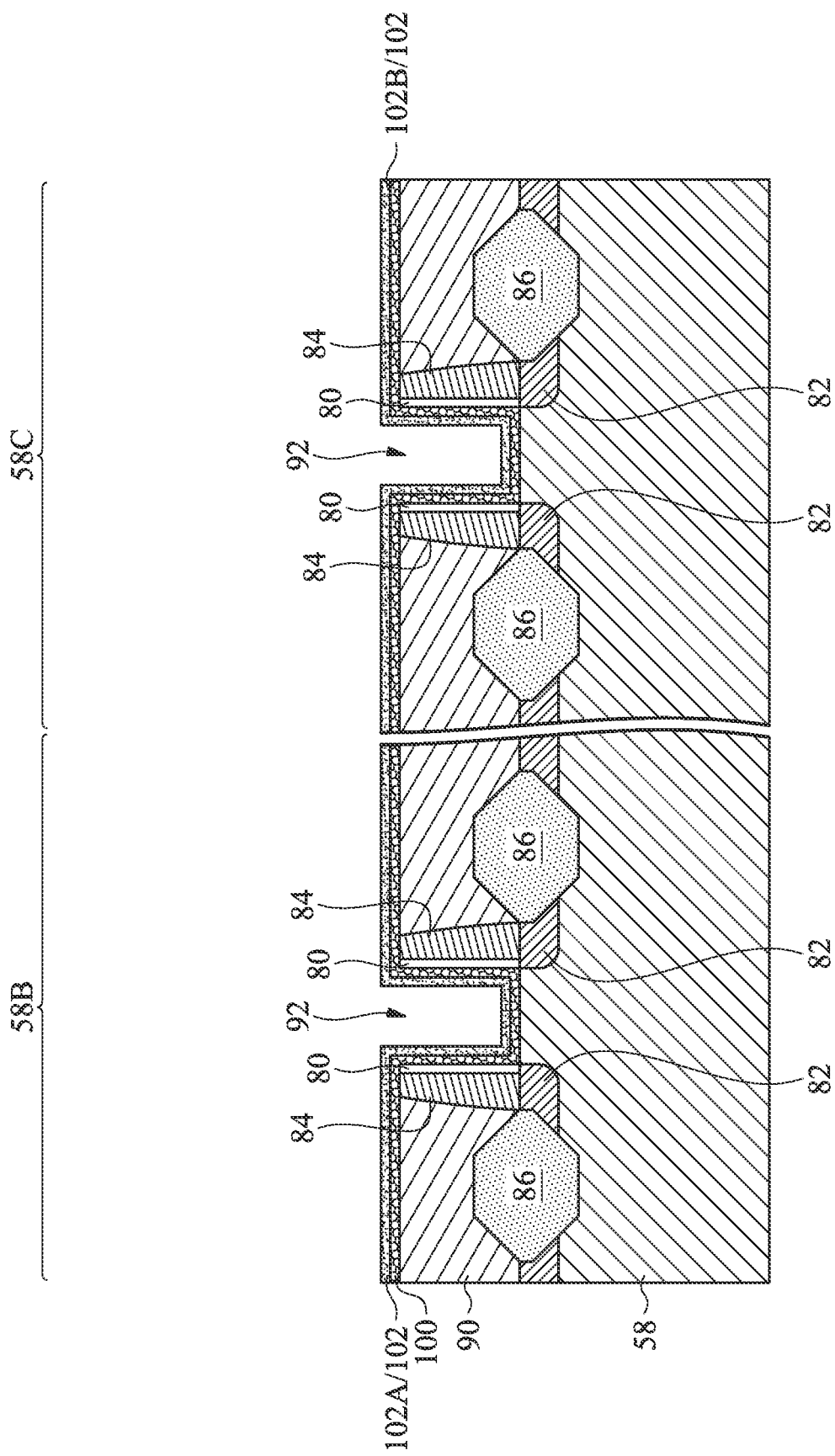

In FIG. 17, an annealing process is performed to drive the dipole-inducing element of the doping layer 104 into and through portions of the gate dielectric layer 102 in region 58B. The annealing process may be performed at a temperature of from about 550° C. to about 1050° C. The annealing process may be performed for a time period of less than about 5 minutes, and the annealing time may depend on the annealing temperature. It should be appreciated that other annealing processes may be performed at other temperatures and for other time periods. After the annealing process, excess portions of the doping layer 104 are removed. The removal may be accomplished by repeating the second etching process, e.g., by etching the doping layer 104 with a HPM.

During the annealing process, some of the dipole-inducing element of the doping layer 104 is driven into the gate dielectric layer 102. Portions of the gate dielectric layer 102 covered by the doping layer 104 (e.g., in the in region 58B) are thus doped with the dipole-inducing element. As such, after the annealing process, first portions 102A of the gate dielectric layer 102 in the region 58B have a higher concentration of the dipole-inducing element than second portions 102B of the gate dielectric layer 102 in the region 58C.

Further, during the annealing process, some of the dipole-inducing element of the doping layer 104 is driven through the gate dielectric layer 102 such that the dipole-inducing element is formed at the interfaces of the gate dielectric layer 102 and interface layer 100 in the region 58B. The dipole-inducing element creates dipole interfaces between the interface layer 100 and gate dielectric layer 102, which may modulate the effective work function of subsequently formed metal gates.

Figure 18:
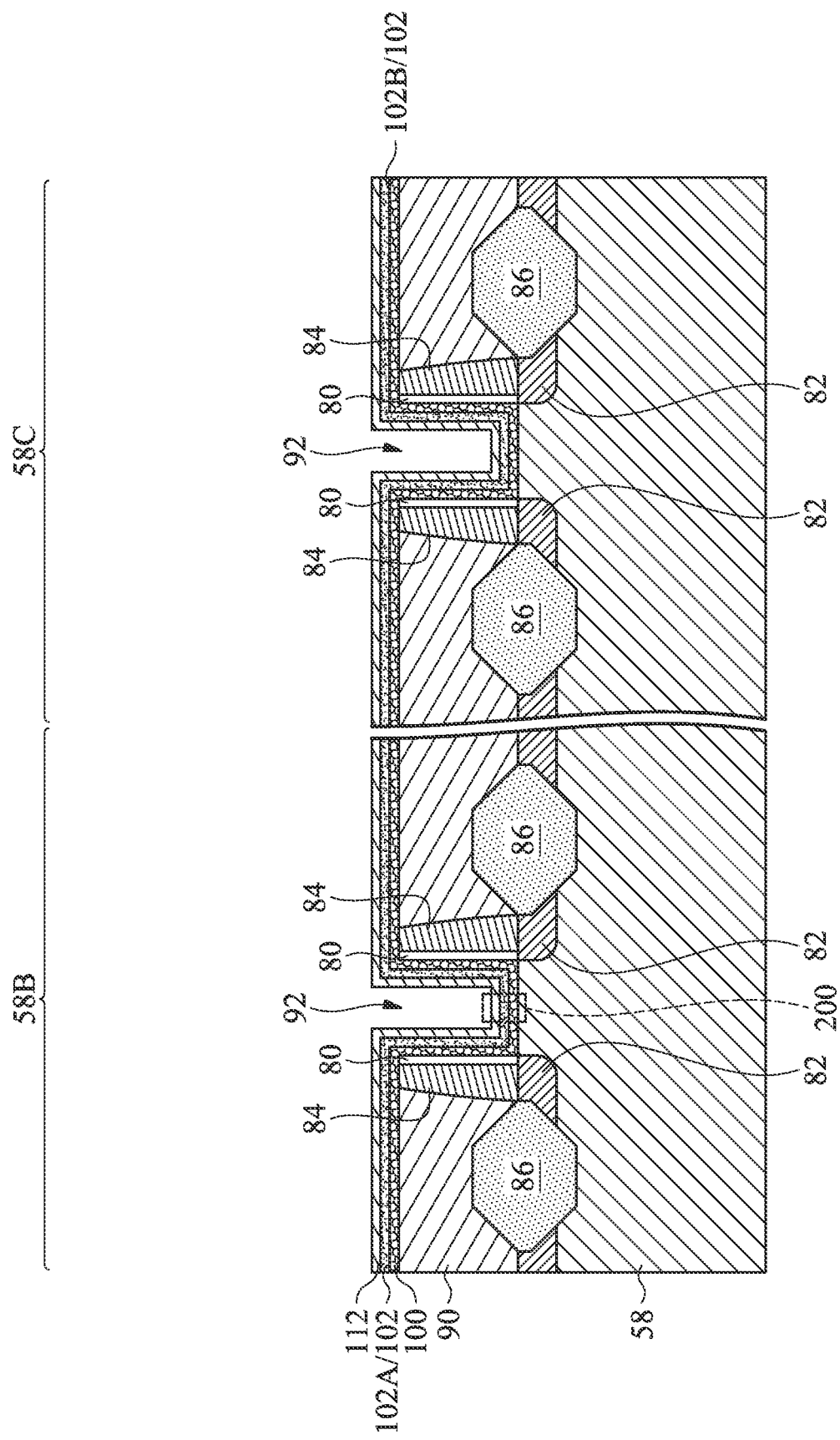

In FIG. 18, a sacrificial layer 112 is formed on the gate dielectric layer 102. The sacrificial layer 112 is a sacrificial layer that will be removed in subsequent processing. Although an etching process is performed to remove the doping layer 104, some residual portions of the doping layer 104 may remain even after the removal etching process. In particular, some particles (e.g., residues or atoms) of the dipole-inducing element may remain in top surfaces of the gate dielectric layer 102 in the region 58B. The material of the sacrificial layer 112 is a material that reacts (e.g., bonds to or interacts) with the dipole-inducing element. The sacrificial layer 112 may be formed from TiAl, TiN, TiAlN, silicon-doped TiN (TiSiN), TaN, or another material that bonds to or interacts with the dipole-inducing elements, and may be formed by a deposition process such as ALD or CVD. In an embodiment, the sacrificial layer 112 is formed to a thickness of from about 10 Å to about 30 Å.

Figure 19:
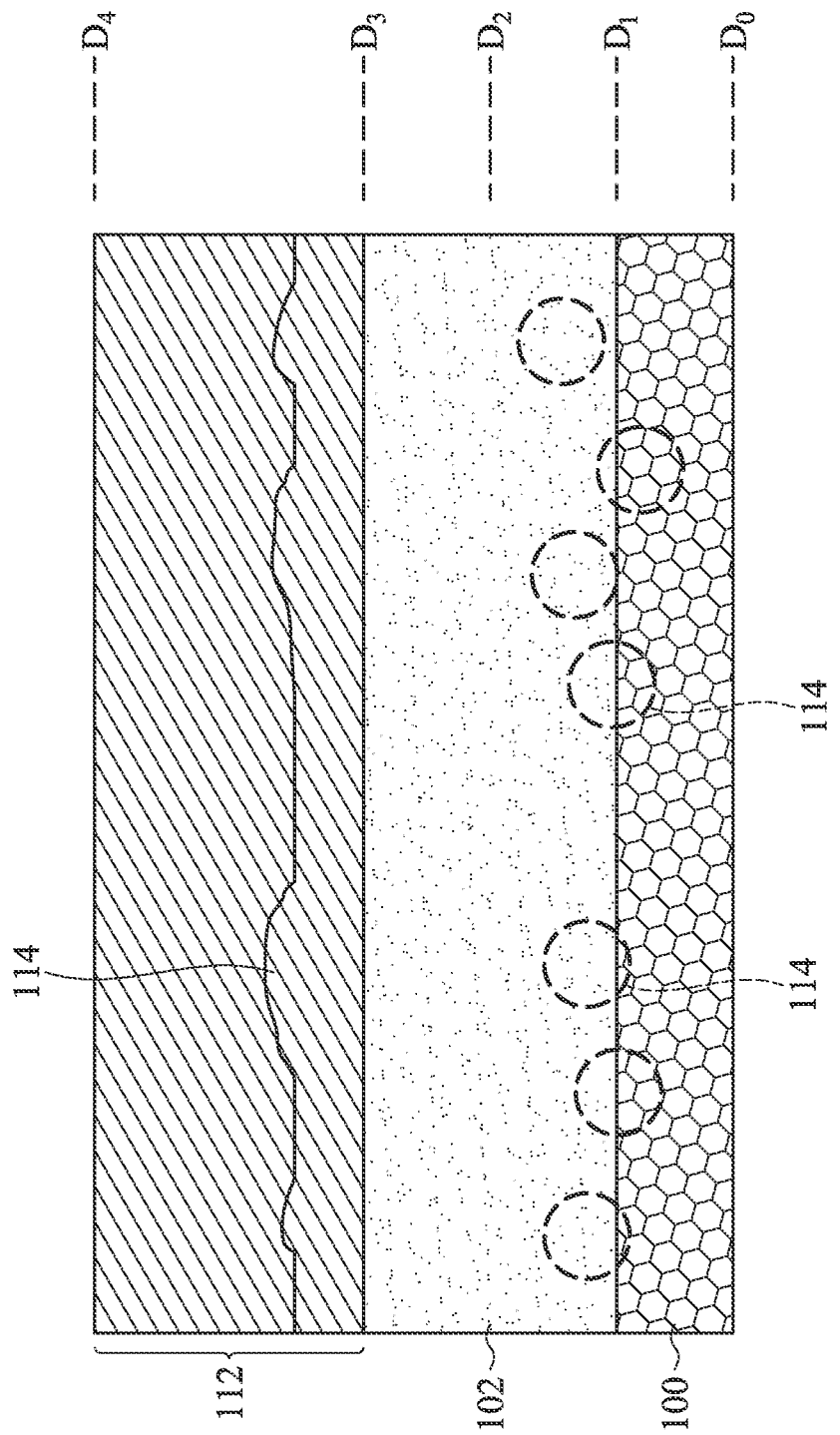

FIG. 19 is a detailed view of the region 200 shown in FIG. 18. As can be seen, the dipole-inducing element 114 has been driven through the gate dielectric layer 102 and is at the interface of the gate dielectric layer 102 and interface layer 100 in the region 58B. Further, portions of the sacrificial layer 112 in contact with the gate dielectric layer 102 have bonded or interacted with residual particles of the dipole-inducing element 114 at the top surface of the gate dielectric layer 102.

Figure 20:
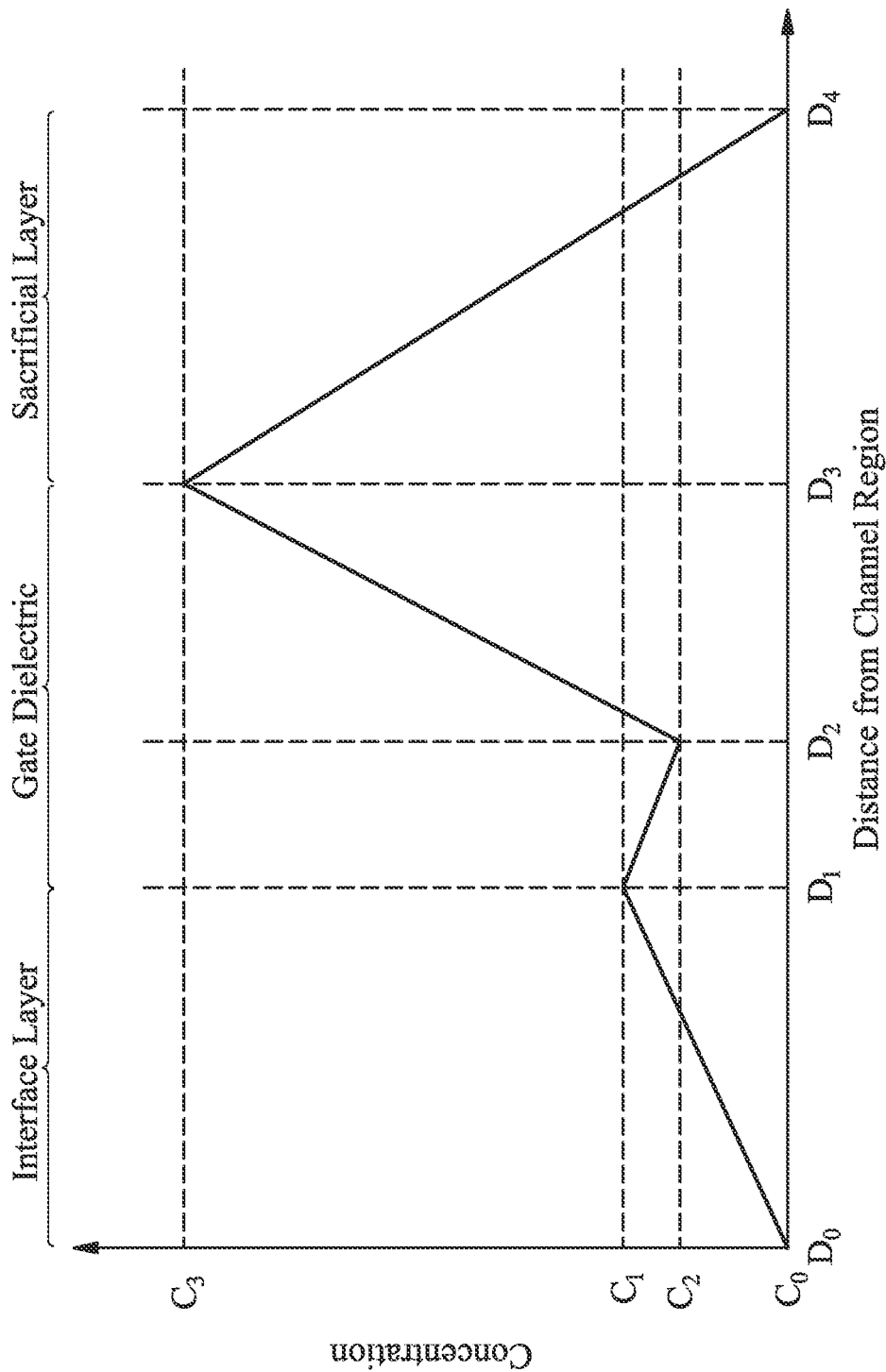
FIG. 20 is a graph illustrating doping concentrations of a gate dielectric layer, in accordance with some embodiments.
Figure 21:
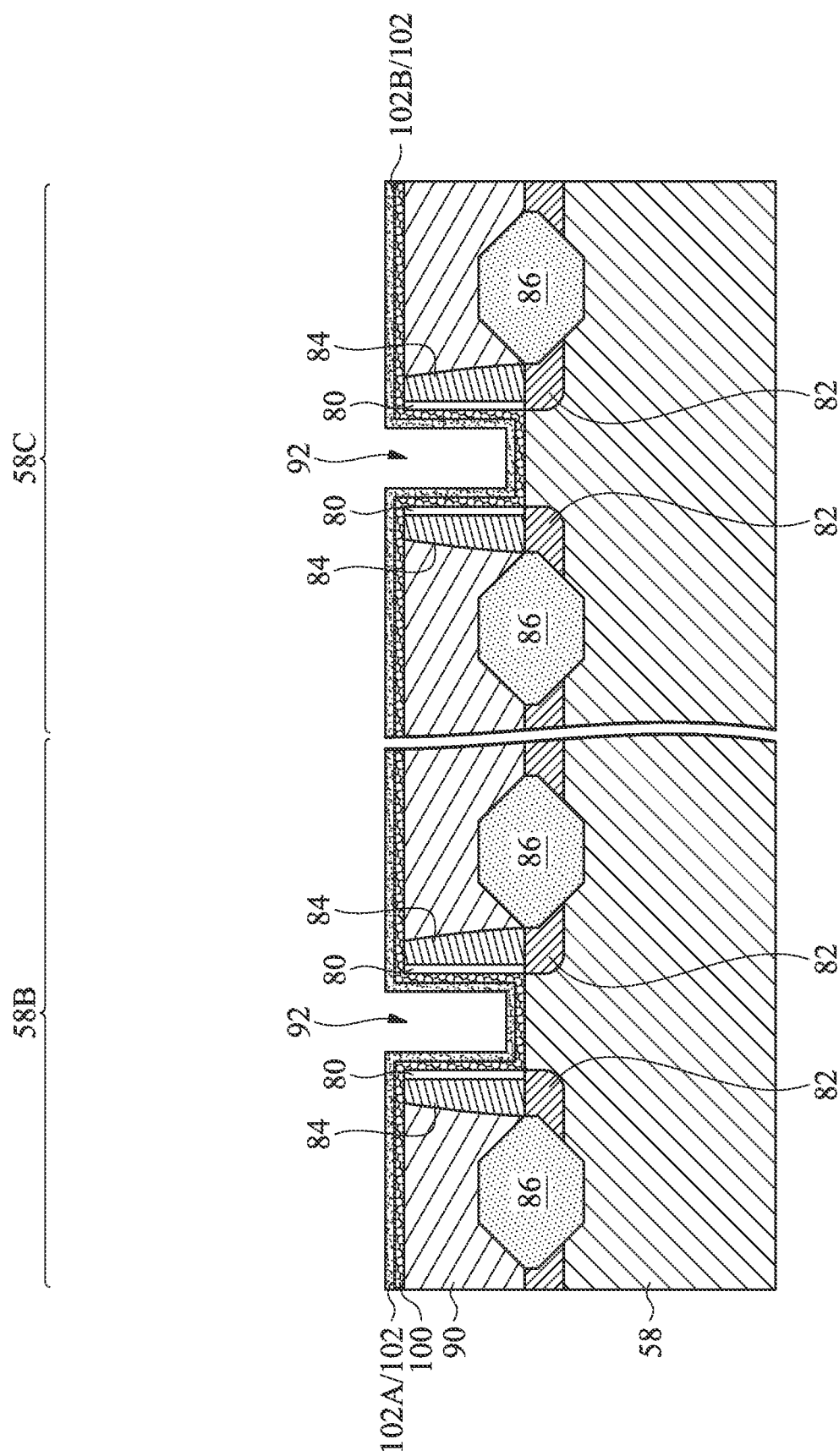
FIGS. 21, 22, and 23 are cross-sectional views of intermediate stages in the manufacturing of FinFETs, in accordance with some embodiments.

FIG. 20 is a graph illustrating the concentration of the dipole-inducing element at different distances from the channel regions of the fins 58. As shown, the concentration increases (e.g., has a positive gradient) through the interface layer 100 to a first concentration $C_1$ at a first distance $D_1$. The concentration decreases (e.g., has a negative gradient) through a portion of the gate dielectric layer 102 to a second concentration $C_2$ at a second distance $D_2$, and then begins increasing again through the remaining portions of the gate dielectric layer 102 to a third concentration $C_3$ at a third distance $D_3$. Finally, the concentration decreases through the sacrificial layer 112 to a fourth distance $D_4$ In FIG. 21, the sacrificial layer 112 is removed. The sacrificial layer 112 may be removed with an acceptable etching process. In an embodiment, the sacrificial layer 112 is removed with a wet etching process using an APM. The APM may include $NH_4OH$, $H_2O_2$, and $H_2O$, respectively, at ratios of from about 1:1:3 to about 1:1:100. The amount of $H_2O$ may depend on the temperature of the wet etch. The wet etch may be performed at a temperature of from about 30° C. to about 80° C., and may be performed for a time period of from about 10 seconds to about 500 seconds. It should be appreciated that other etch process parameters (e.g., etchants, ratios, temperatures, and/or time periods) may be used. Some of the residual particles of the dipole-inducing element 114 are removed with the sacrificial layer 112. In particular, residual particles at the interface of the sacrificial layer 112 and gate dielectric layer 102 are removed. As such, after removal of the sacrificial layer 112, the residue of the dipole-inducing element 114 at the top surface of the gate dielectric layer 102 may be eliminated or at least reduced. The reduction occurs in both regions 58B and 58C.

Figure 22:
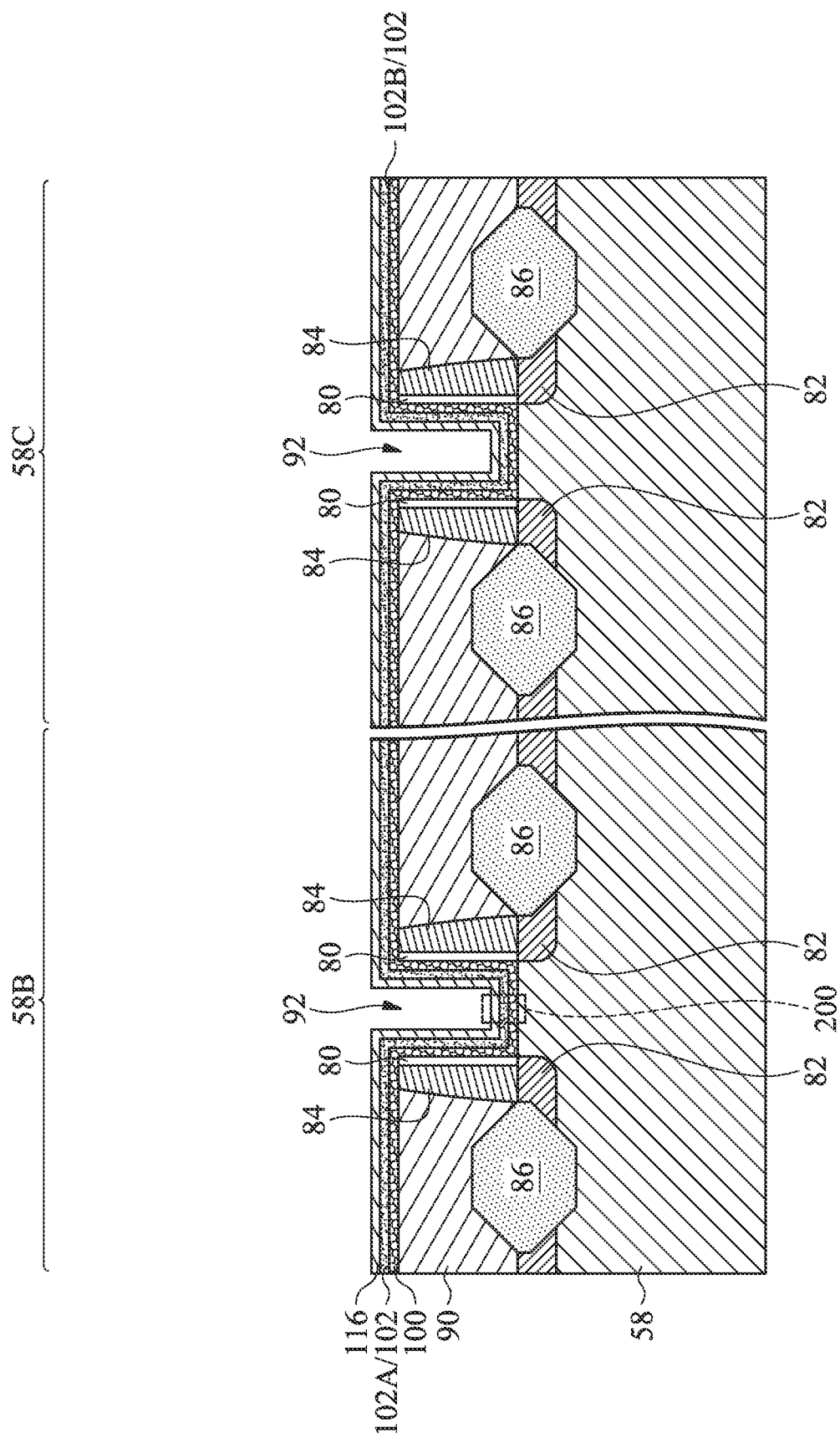

In FIG. 22, a capping layer 116 is formed on the gate dielectric layer 102. The capping layer 116 may be formed from a similar material as the sacrificial layer 112, and may be formed using a similar deposition process. In an embodiment, the capping layer 116 is formed to a thickness of from about 10 Å to about 20 Å. After deposition, the capping layer 116 may optionally be annealed. In embodiments where the capping layer 116 is annealed, the annealing process is performed in-situ with the deposition process, e.g., is performed in a same chamber without breaking a vacuum between the deposition and annealing processes. The annealing processes may be performed at a temperature of from about 550° C. to about 1050° C. The annealing process may be performed for a time period of less than about 5 minutes, and the annealing time may depend on the annealing temperature.

Figure 23:
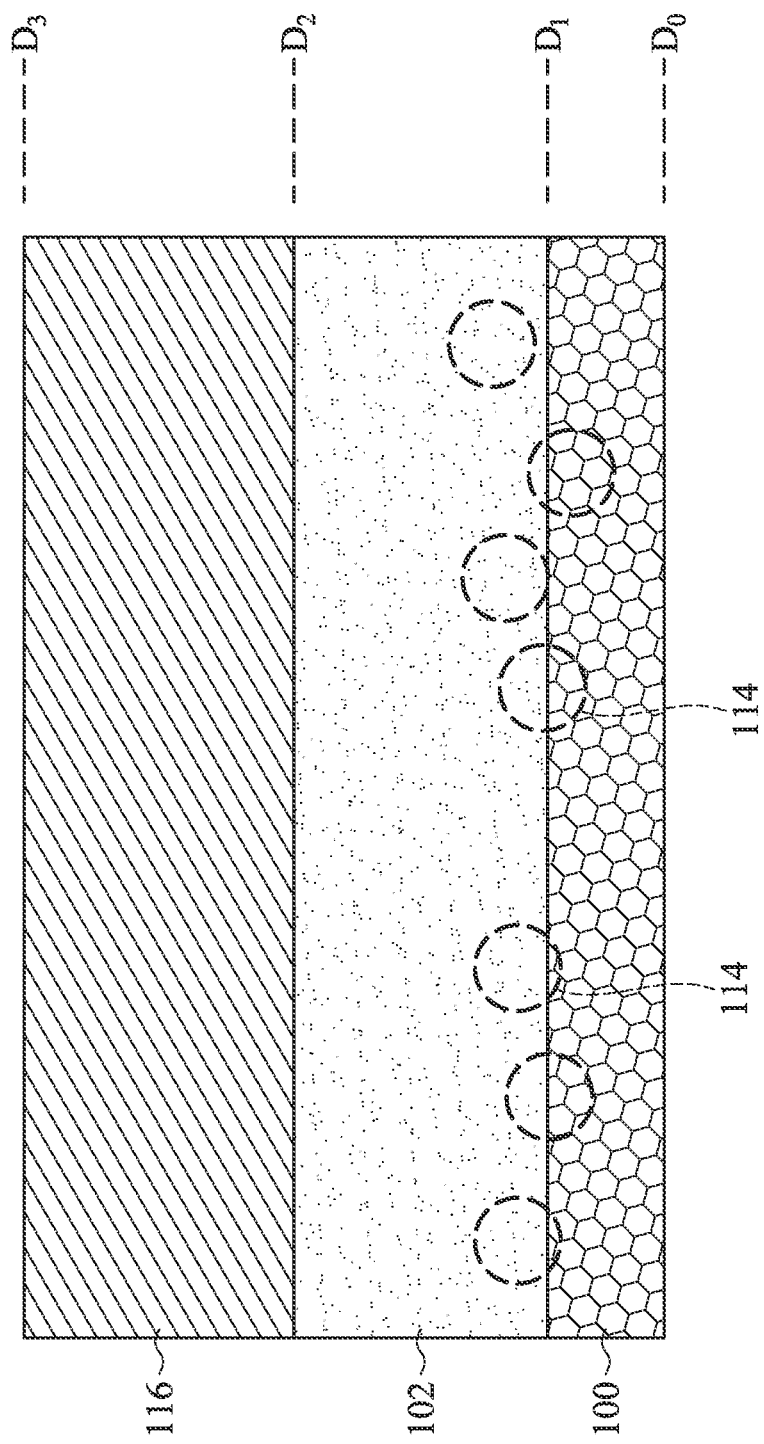

FIG. 23 is a detailed view of the region 200 shown in FIG. 22. As can be seen, the residual particles of the dipole-inducing element 114 at the top surface of the gate dielectric layer 102 have been removed, and the remaining dipole-inducing element 114 particles are at the interface of the gate dielectric layer 102 and the interface layer 100. Presence of the dipole-inducing element 114 at the interface of the gate dielectric layer 102 and capping layer 116 may reduce the breakdown voltage of the gate dielectric layer 102. As such, removing the residual dipole-inducing element 114 on top of the gate dielectric layer 102 may improve the reliability of the subsequently formed FinFET.

Figure 24:
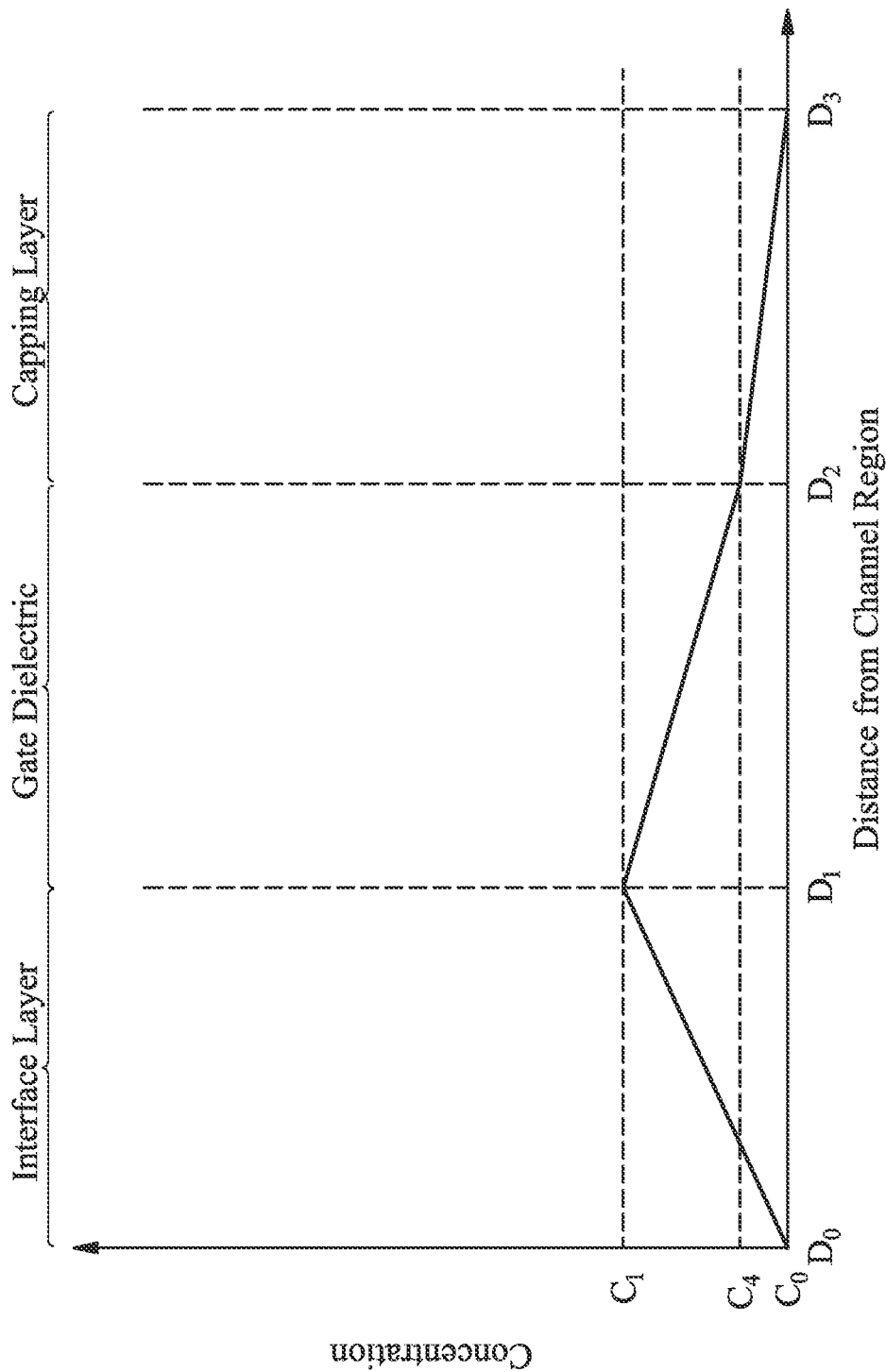
FIG. 24 is a graph illustrating doping concentrations of a gate dielectric layer, in accordance with some embodiments.

FIG. 24 is a graph illustrating the concentration of the dipole-inducing element at different distances from the channel regions of the fins 58 after the sacrificial layer 112 is removed. As shown, the concentration increases (e.g., has a positive gradient) through the interface layer 100 to a first concentration $C_1$ at a first distance $D_1$. The concentration then decreases (e.g., has a negative gradient) through the gate dielectric layer 102 to a fourth concentration $C_4$ at a second distance $D_2$. The concentration through the capping layer 116 to a third distance $D_3$ is less than the concentration through the gate dielectric layer 102, and may decrease to zero or a substantially zero level.

Figure 25:
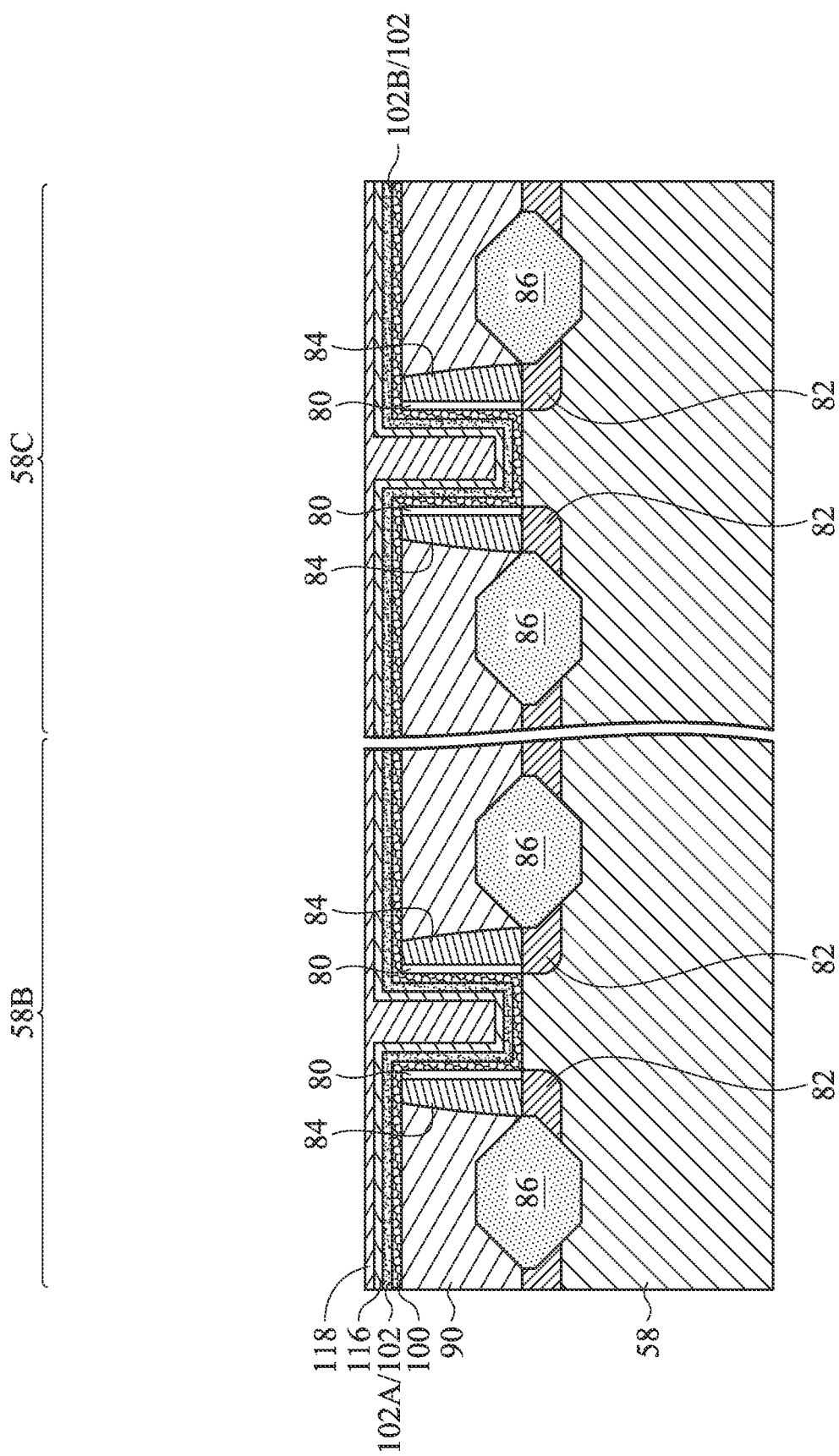
FIGS. 25, 26, and 27 are cross-sectional views of intermediate stages in the manufacturing of FinFETs, in accordance with some embodiments.

In FIG. 25, a gate electrode layer 118 is deposited over the capping layer 116 and in the recesses 92. The gate electrode layer 118 may be a metal-containing material such as TiN, TaN, TaC, Co, Ru, Al, combinations thereof, or multi-layers thereof. Although a single gate electrode layer 118 is shown, any number of work function tuning layers may be deposited in the recesses 92.

Figure 26:
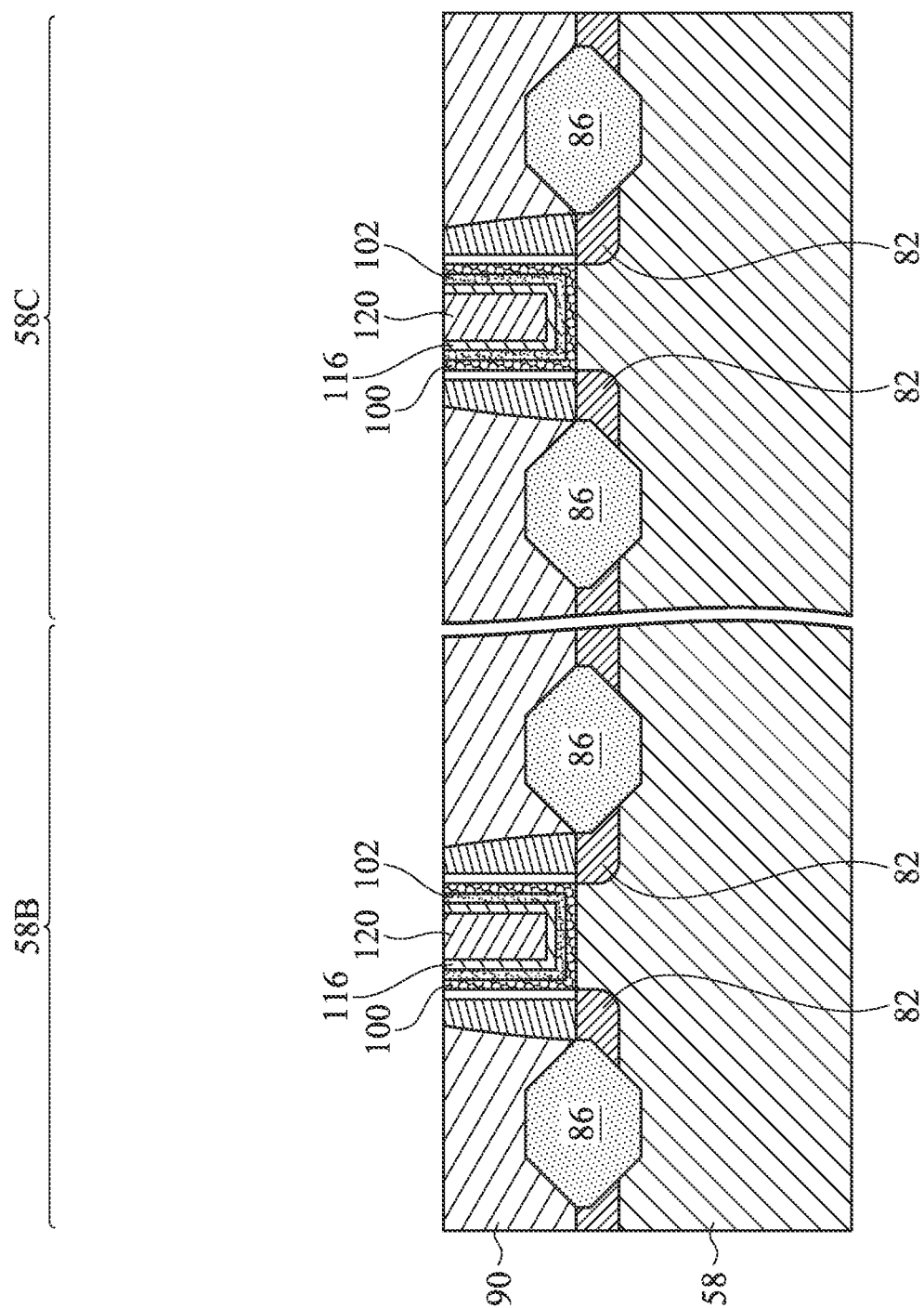

In FIG. 26, a planarization process, such as a CMP, is performed to remove the excess portions of the interface layer 100, gate dielectric layer 102, capping layer 116, and gate electrode layer 118, which excess portions are over the top surface of the ILD 90. The remaining portions of the gate electrode layer 118 form gate electrodes 120, which in combination with the other layers, form replacement gates of the resulting FinFETs. The interface layer 100, gate dielectric layer 102, capping layer 116, and gate electrodes 120 may be collectively referred to as the "gates" or "gate stacks" of the resulting FinFETs. The gate stacks may extend along sidewalls of the channel region of the fins 58.

Figure 27:
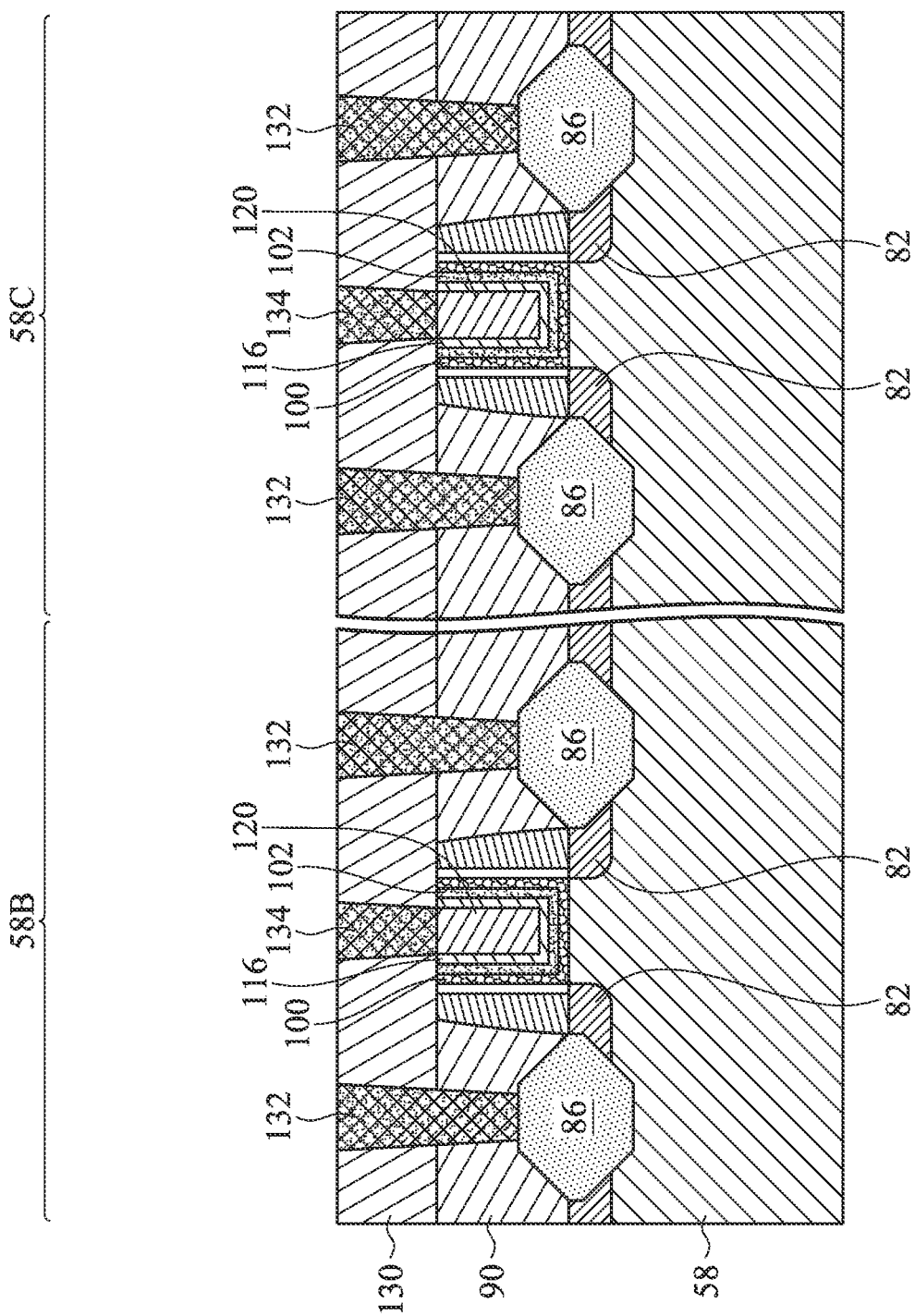

In FIG. 27, an ILD 130 is formed over the gate stacks and ILD 90. In an embodiment, the ILD 130 is a flowable film formed by a flowable CVD method. In some embodiments, the ILD 130 is formed of a dielectric material such as PSG, BSG, BPSG, USG, or the like, and may be deposited by any suitable method, such as CVD and PECVD.

Source/drain contacts 132 and gate contacts 134 are formed through the ILDs 90 and 130. Openings for the source/drain contacts 132 are formed through the ILDs 90 and 130, and openings for the gate contacts 134 are formed through the ILD 130. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 130. The remaining liner and conductive material form the source/drain contacts 132 and gate contacts 134 in the openings. An anneal process may be performed to form a silicide at the interface between the epitaxial source/drain regions 86 and the source/drain contacts 132. The source/drain contacts 132 are physically and electrically coupled to the epitaxial source/drain regions 86, and the gate contacts 134 are physically and electrically coupled to the gate electrodes 120. The source/drain contacts 132 and gate contacts 134 may be formed in different processes, or may be formed in the same process. Although shown as being formed in the same cross-sections, it should be appreciated that each of the source/drain contacts 132 and gate contacts 134 may be formed in different cross-sections, which may avoid shorting of the contacts.

Figure 28:
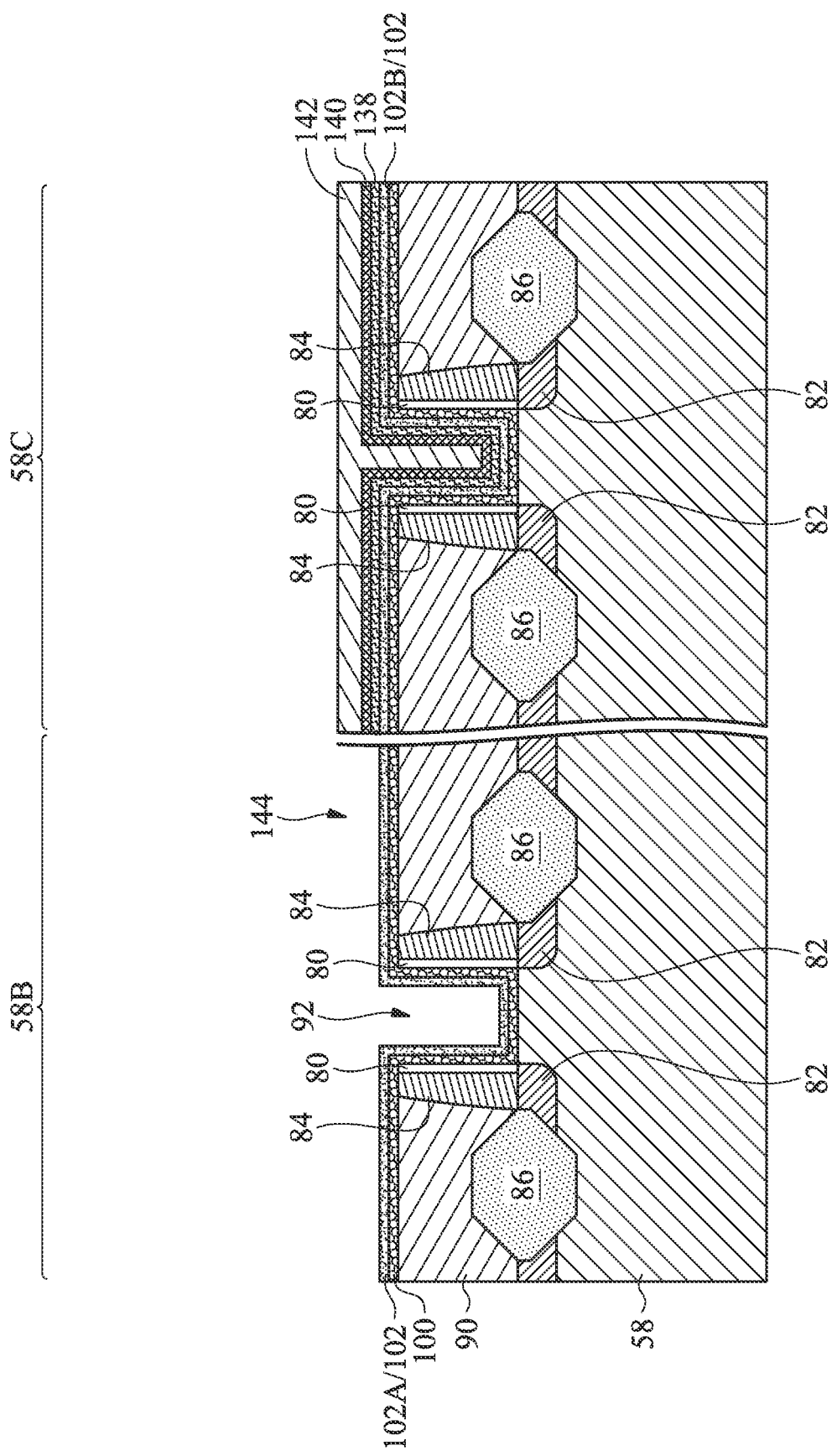
FIGS. 28, 29, and 30 are cross-sectional views of intermediate stages in the manufacturing of FinFETs, in accordance with some other embodiments.
Figure 29:
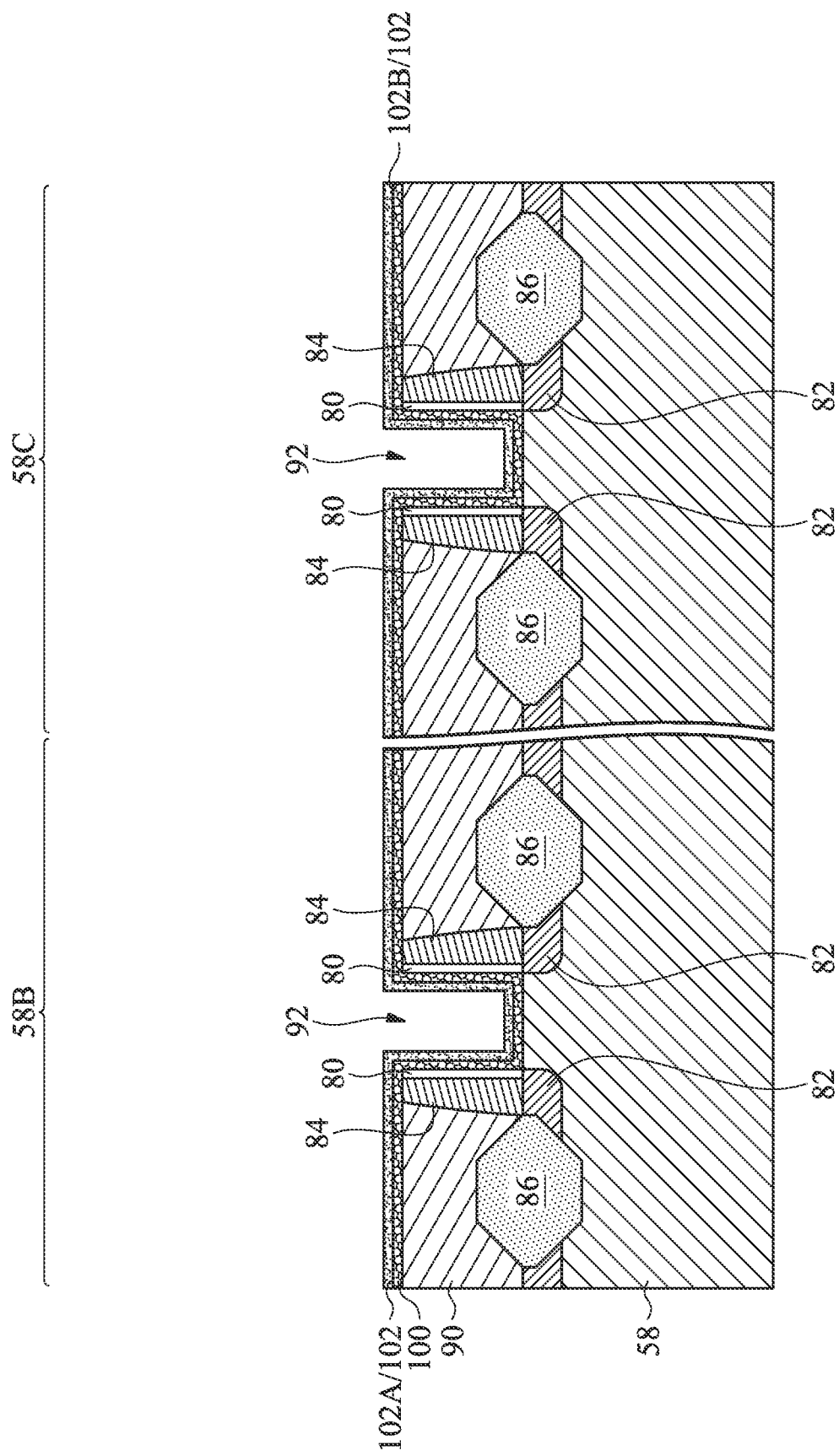
Figure 30:
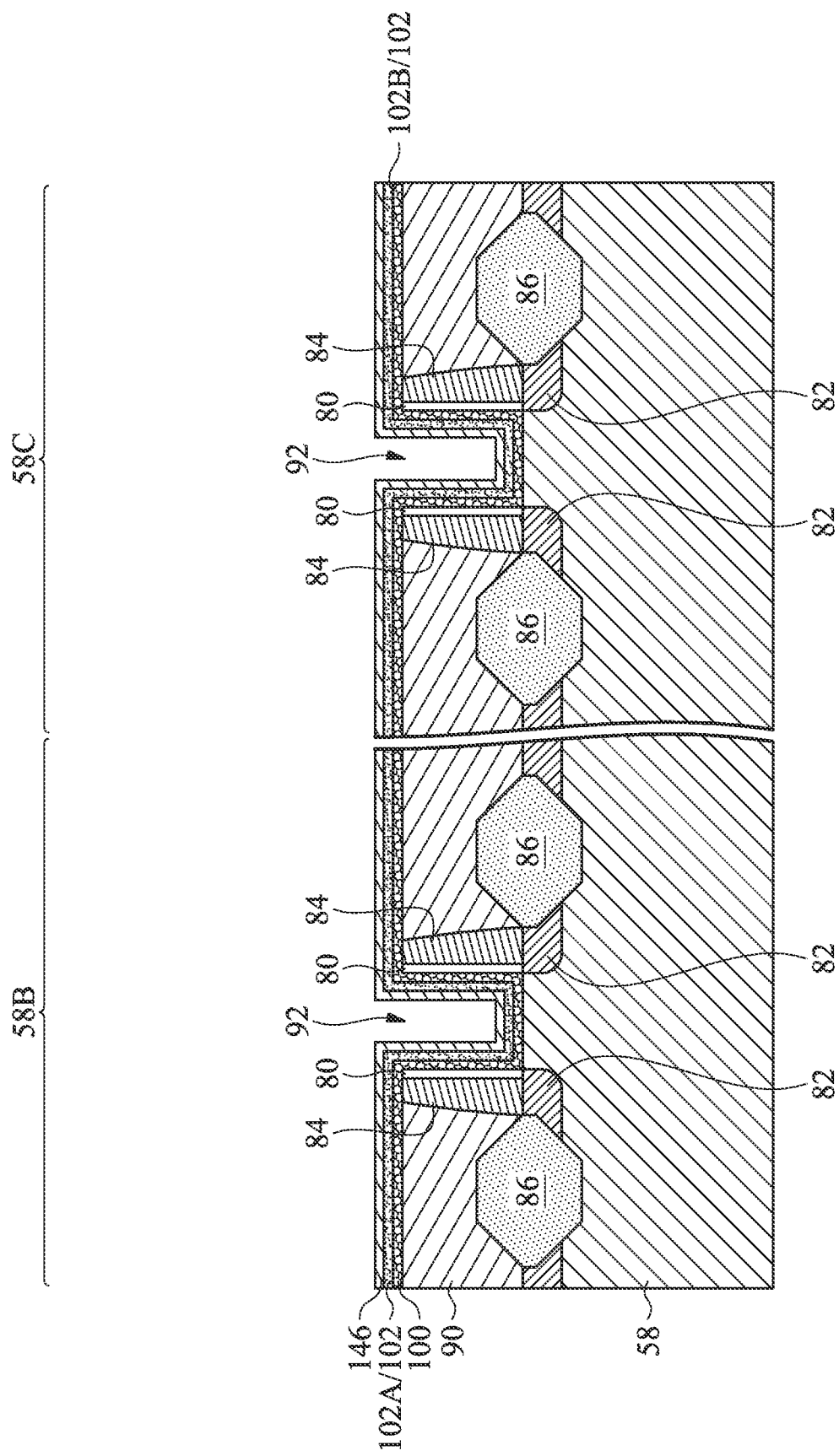

FIGS. 28 through 30 are cross-sectional views of intermediate stages in the manufacturing of FinFETs, in accordance with some other embodiments. FIGS. 28 through 30 illustrate an embodiment where the process for forming the doping layer 104 and driving the dipole-inducing element into the gate dielectric layer 102 is repeated in different regions. Optionally, the dopants may have different concentrations in the different regions. The process shown in FIGS. 28 through 30 may be performed after the sacrificial layer 112 is removed (see FIG. 21), and before the capping layer 116 is formed (see FIG. 22).

In FIG. 28, a second doping layer 138 is formed over the gate dielectric layer 102. The second doping layer 138 may be similar to the doping layer 104. The thickness of the second doping layer 138 may be different than the thickness of the doping layer 104, such that different regions of the gate dielectric layer 102 are doped with different concentrations of the dipole-inducing element. The threshold voltages of the formed FinFET devices vary with the doping concentration. A second mask layer 140 is formed over the second doping layer 138. The second mask layer 140 may be similar to the mask layer 106. A photoresist 142 is formed over the second mask layer 140. The photoresist 142 may be similar to the photoresist 108, and may be patterned with openings 144 exposing the recesses 92 in the region 58B. A plurality of etching processes are then performed to transfer the pattern of the photoresist 142 to the second doping layer 138. The etching processes may be similar to the etching processes used for patterning the doping layer 104.

In FIG. 29, an annealing process is performed to drive the dipole-inducing element of the second doping layer 138 into and through portions of the gate dielectric layer 102 in region 58C. Portions of the gate dielectric layer 102 covered by the second doping layer 138 (e.g., in the in region 58C) are thus doped with the dipole-inducing element. After the annealing process, the second portions 102B of the gate dielectric layer 102 in the region 58C are thus doped to have a different concentration of the dipole-inducing element than the first portions 102A of the gate dielectric layer 102 in the region 58B.

In FIG. 30, a second sacrificial layer 146 is formed on the gate dielectric layer 102. The second sacrificial layer 146 may be similar to the sacrificial layer 112. The second sacrificial layer 146 is then removed, and may be removed in a similar manner as the sacrificial layer 112. After the second sacrificial layer 146 is removed, the capping layer 116 may be formed and processing may be continued as described above to form FinFET devices.

It should be appreciated that the doping parameters may be varied. Further, it should be appreciated that no dipole doping may be performed in some regions. For example, the gate dielectric layer 102 in a first region (e.g., region 58B) may have a first dopant concentration of the dipole-inducing element and may have a first threshold voltage; the gate dielectric layer 102 in a second region (e.g., region 58C) may have a second dopant concentration of the dipole-inducing element and may have a second threshold voltage; and the gate dielectric layer 102 in a third region (not shown) may be free from the dipole-inducing element and may have a third threshold voltage. Further, it should be appreciated that the different regions may be in a same fin 58 (as illustrated herein), or in different fins 58 (not shown). In embodiments where the different regions are in different fins 58, the gate dielectric layer 102 that is doped may span multiple fins 58.

Embodiments may achieve advantages. Driving dipole-inducing elements into the gate dielectric layer 102 forms dipole interfaces between the interface layer 100 and gate dielectric layer 102, which may modulate the effective work function of the gate electrodes 120, allowing gate electrodes 120 with different threshold voltages to be created in different regions 58B and 58C. Further, breakdown of the gate dielectric layer 102 may be reduced when the gate dielectric layer 102 is doped with dipole-inducing elements. Sacrificial formation and removal of the sacrificial layer 112 may reduce the amount of residual dipole-inducing elements at the interface of the gate dielectric layer 102 and capping layer 116, which may improve the interface between the gate dielectric layer 102 and capping layer 116, increase the breakdown voltage (and consequently, the lifetime) of the gate dielectric layer 102, and improve the reliability of the subsequently formed FinFET. Finally, forming and removing the sacrificial layer 112 may reduce the amount of residual dipole-inducing elements at the interface of the gate dielectric layer 102 and capping layer 116 without substantially decreasing the amount of residual dipole-inducing elements at the interface of the interface layer 100 and gate dielectric layer 102.

In an embodiment, a device includes: a first fin extending from a substrate; a first interface layer on a first channel region of the first fin, the first interface layer being doped with a dipole-inducing element, a first concentration of the dipole-inducing element in the first interface layer increasing in a first direction extending away from the first fin; a first gate dielectric layer on the first interface layer, the first gate dielectric layer being doped with the dipole-inducing element, a second concentration of the dipole-inducing element in the first gate dielectric layer decreasing in the first direction extending away from the first fin; a first capping layer on the first gate dielectric layer; and a first gate electrode on the first capping layer.

In some embodiments of the device, the first capping layer is substantially free from the dipole-inducing element. In some embodiments of the device, the first capping layer is doped with the dipole-inducing element, a third concentration of the dipole-inducing element in the first capping layer being less than the second concentration of the dipole-inducing element in the first gate dielectric layer. In some embodiments, the device further includes: a second fin extending from the substrate; a second interface layer on a second channel region of the second fin, the second interface layer being doped with the dipole-inducing element, a third concentration of the dipole-inducing element in the second interface layer increasing in a second direction extending away from the second fin, a rate of increase of the third concentration being different than a rate of increase of the first concentration; and a second gate dielectric layer on the second interface layer; a second capping layer on the second gate dielectric layer; and a second gate electrode on the second capping layer. In some embodiments, the device further includes: a second fin extending from the substrate; a second interface layer on a second channel region of the second fin, the second interface layer being substantially free from the dipole-inducing element; and a second gate dielectric layer on the second interface layer, the second gate dielectric layer being substantially free from the dipole-inducing element; a second capping layer on the second gate dielectric layer; and a second gate electrode on the second capping layer. In some embodiments of the device, the dipole-inducing element is La.

In an embodiment, a method includes: forming a gate dielectric layer on an interface layer; forming a doping layer on the gate dielectric layer, the doping layer including a dipole-inducing element; annealing the doping layer to drive the dipole-inducing element through the gate dielectric layer to a first side of the gate dielectric layer adjacent the interface layer; removing the doping layer; forming a sacrificial layer on the gate dielectric layer, a material of the sacrificial layer reacting with residual dipole-inducing elements at a second side of the gate dielectric layer adjacent the sacrificial layer; removing the sacrificial layer; forming a capping layer on the gate dielectric layer; and forming a gate electrode layer on the capping layer.

In some embodiments of the method, the doping layer is an oxide, nitride, or carbide of La. In some embodiments of the method, the sacrificial layer and the capping layer are formed from a same material. In some embodiments of the method, forming the sacrificial layer includes: depositing a first TiSiN layer on the gate dielectric layer. In some embodiments of the method, the removing the sacrificial layer includes: etching the first TiSiN layer with an ammonia peroxide mixture (APM) including $NH_4OH$, $H_2O_2$, and $H_2O$, respectively, at ratios of from about 1:1:3 to about 1:1:100. In some embodiments of the method, the first TiSiN layer is etched for a time period of from about 10 seconds to about 500 seconds and at a temperature of from about 30° C. to about 80° C. In some embodiments of the method, the first TiSiN layer is deposited to a thickness of from about 10 Å to about 30 Å. In some embodiments of the method, forming the capping layer includes: depositing a second TiSiN layer on the gate dielectric layer to a thickness of from about 10 Å to about 20 Å. In some embodiments, the method further includes: annealing the second TiSiN layer at a temperature of from about 500° C. to about 1000° C., the second TiSiN layer deposited and annealed in a same chamber without breaking a vacuum between the depositing and the annealing.

In an embodiment, a method includes: forming an interface layer over a first channel region and a second channel region; forming a gate dielectric layer over the interface layer; forming a dipole interface between portions of the gate dielectric layer and the interface layer over the first channel region; forming a sacrificial layer on the gate dielectric layer, a material of the sacrificial layer reacting with residual dipole-inducing elements at a side of the gate dielectric layer adjacent the sacrificial layer; removing the sacrificial layer and the residual dipole-inducing elements; forming a capping layer on the gate dielectric layer; and forming a first gate electrode and a second gate electrode on the capping layer, the first gate electrode being over the first channel region, the second gate electrode being over the second channel region.

In some embodiments of the method, the sacrificial layer and the residual dipole-inducing elements are removed in a same wet etching process. In some embodiments of the method, the first channel region and the second channel region are in a same semiconductor fin. In some embodiments of the method, the first channel region and the second channel region are in different semiconductor fins. In some embodiments of the method, the first gate electrode and the second gate electrode have different work functions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a channel region above a substrate;
an interface layer on the channel region, the interface layer being doped with a dipole-inducing element, a first concentration of the dipole-inducing element in the interface layer increasing in a first direction extending away from the channel region;
a high-k dielectric layer on the interface layer, the high-k dielectric layer being doped with the dipole-inducing element, a second concentration of the dipole-inducing element in the high-k dielectric layer decreasing in the first direction extending away from the channel region; and
a gate electrode on the high-k dielectric layer.

2. The device of claim 1, wherein the dipole-inducing element is lanthanum.

3. The device of claim 1 further comprising:
a fin extending from the substrate, the fin comprising the channel region.

4. The device of claim 1 further comprising:
an isolation region, the channel region protruding from the isolation region, the high-k dielectric layer extending along a top surface of the isolation region.

5. The device of claim 1 further comprising:
a source/drain region adjacent the channel region;
a first inter-layer dielectric on the source/drain region;
a second inter-layer dielectric on the first inter-layer dielectric;
a source/drain contact extending through the second inter-layer dielectric and the first inter-layer dielectric to contact the source/drain region; and
a gate contact extending through the second inter-layer dielectric to contact the gate electrode.

6. The device of claim 1, wherein the interface layer comprises silicon oxide, and the high-k dielectric layer comprises hafnium oxide.

7. The device of claim 1 further comprising:
a capping layer between the high-k dielectric layer and the gate electrode.

8. A device comprising:
a first transistor comprising:
a first channel region;
a first gate dielectric layer on the first channel region, the first gate dielectric layer being doped with a dipole-inducing element, a concentration of the dipole-inducing element in the first gate dielectric layer decreasing in a first direction, the first direction extending away from the first channel region; and
a first gate electrode on the first gate dielectric layer; and
a second transistor comprising:
a second channel region;
a second gate dielectric layer on the second channel region, the second gate dielectric layer being free from the dipole-inducing element; and
a second gate electrode on the second gate dielectric layer.

9. The device of claim 8 further comprising:
a first fin extending from a substrate, the first fin comprising the first channel region and the second channel region.

10. The device of claim 8 further comprising:
a first fin extending from a substrate, the first fin comprising the first channel region; and
a second fin extending from the substrate, the second fin comprising the second channel region.

11. The device of claim 8, wherein the dipole-inducing element is lanthanum.

12. The device of claim 8, wherein the first transistor further comprises a first capping layer between the first gate dielectric layer and the first gate electrode, and the second transistor further comprises a second capping layer between the second gate dielectric layer and the second gate electrode.

13. The device of claim 12, wherein the first capping layer and the second capping layer each comprise TiSiN.

14. The device of claim 8, wherein the first transistor and the second transistor have different threshold voltages.

15. The device of claim 8, wherein the first transistor further comprises a first interface layer between the first gate dielectric layer and the first channel region, and the second transistor further comprises a second interface layer between the second gate dielectric layer and the second channel region.

16. A device comprising:
a first transistor comprising:
a first channel region;
a first interface layer on the first channel region, the first interface layer being doped with a dipole-inducing element, a first concentration of the dipole-inducing element in the first interface layer increasing in a first direction extending away from the first channel region;

a first high-k dielectric layer on the first interface layer, the first high-k dielectric layer being doped with the dipole-inducing element; and a first gate electrode on the first high-k dielectric layer; and a second transistor comprising:

a second channel region;

a second interface layer on the second channel region, the second interface layer being doped with the dipole-inducing element, a second concentration of the dipole-inducing element in the second interface layer increasing in a second direction extending away from the second channel region;

a second high-k dielectric layer on the second interface layer, the second high-k dielectric layer being doped with the dipole-inducing element, the second high-k dielectric layer having a different concentration of the dipole-inducing element than the first high-k dielectric layer; and a second gate electrode on the second high-k dielectric layer.

17. The device of claim 16 further comprising:

a first fin extending from a substrate, the first fin comprising the first channel region and the second channel region.

18. The device of claim 16 further comprising: and a first fin extending from a substrate, the first fin comprising the first channel region;

a second fin extending from the substrate, the second fin comprising the second channel region.

19. The device of claim 16, wherein the dipole-inducing element is lanthanum.

20. The device of claim 16 further comprising:

a first gate spacer, the first interface layer extending along a sidewall of the first gate spacer; and a second gate spacer, the second interface layer extending along a sidewall of the second gate spacer.

* * * * *

UNITED STATES PATENT AND TRADEMARK OFFICE
CERTIFICATE OF CORRECTION

PATENT NO. : 11,855,098 B2
APPLICATION NO. : 17/986379
DATED : December 26, 2023
INVENTOR(S) : Tsai et al.

Page 1 of 1

It is certified that error appears in the above-identified patent and that said Letters Patent is hereby corrected as shown below:

In the Claims

In Column 18, in Claim 18, Line 8, after "comprising:" delete "and".

In Column 18, in Claim 18, Line 10, after "region;" insert -- and --.

Signed and Sealed this
Twenty-sixth Day of March, 2024

Katherine Kelly Vidal
*Director of the United States Patent and Trademark Office*